United States Patent
Teo et al.

(10) Patent No.: US 10,359,586 B2
(45) Date of Patent: Jul. 23, 2019

(54) STRATEGIC PLACEMENT OF PLASTIC STRUCTURES FOR EMI MANAGEMENT OF TRANSCEIVER MODULE

(71) Applicant: FINISAR CORPORATION, Sunnyvale, CA (US)

(72) Inventors: Tat Ming Teo, Singapore (SG); John Hsieh, Cupertino, CA (US); William H. Wang, Pleasanton, CA (US); Jinxiang Liu, Singapore (SG); Hon Siu Wee, Singapore (SG); Troy Wy Piew Chiang, Singapore (SG)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 14/873,743

(22) Filed: Oct. 2, 2015

(65) Prior Publication Data
US 2017/0097484 A1   Apr. 6, 2017

(51) Int. Cl.
*G02B 6/42* (2006.01)
*H05K 1/02* (2006.01)
*H05K 7/14* (2006.01)
*H05K 9/00* (2006.01)
*G02B 6/38* (2006.01)

(52) U.S. Cl.
CPC ............ *G02B 6/4277* (2013.01); *G02B 6/423* (2013.01); *G02B 6/428* (2013.01); *G02B 6/4246* (2013.01); *G02B 6/4255* (2013.01); *G02B 6/4284* (2013.01); *G02B 6/4292* (2013.01); *H05K 1/0216* (2013.01); *H05K 1/0274* (2013.01); *H05K 7/1427* (2013.01);
(Continued)

(58) Field of Classification Search
CPC .... G02B 6/423; G02B 6/4246; G02B 6/4255; G02B 6/4277; G02B 6/428; G02B 6/4284; G02B 6/4292; H05K 1/0216; H05K 1/0274; H05K 7/1427; H05K 9/0058; H05K 2201/10121
USPC ...................................... 385/88–94, 134–139
See application file for complete search history.

(56) References Cited

U.S. PATENT DOCUMENTS 5,337,396 A   8/1994 Chen et al.
6,000,856 A   12/1999 Yunker
(Continued)

OTHER PUBLICATIONS

International Search Report and Written Opinion dated Dec. 9, 2016 in PCT Application No. PCT/US2016/055230.
(Continued)

*Primary Examiner* — Michael P Mooney
(74) *Attorney, Agent, or Firm* — Maschoff Brennan

(57) ABSTRACT

An example optoelectronic module includes a housing that extends between a first end portion and a second end portion. The optoelectronic module includes a printed circuit board ("PCB") that includes an electrical connector at the second end portion of the housing, at least one transmitter electrically coupled to the PCB and optically coupled with at least one optical fiber, at least one receiver electrically coupled to the PCB and optically coupled with at least one optical fiber, and at least one electromagnetic interference ("EMI") attenuating component formed of a plastic material that is configured to attenuate EMI. The EMI attenuating component is configured to attenuate EMI generated by one or more other components of the optoelectronic module.

10 Claims, 29 Drawing Sheets

(52) U.S. Cl.
CPC ......... *H05K 9/0058* (2013.01); *G02B 6/3874* (2013.01); *H05K 2201/10121* (2013.01)

(56) References Cited

U.S. PATENT DOCUMENTS

| | | | |
|---|---|---|---|
| 6,856,769 | B1 | 2/2005 | Steffensen et al. |
| 7,917,037 | B2* | 3/2011 | Liu .................... G02B 6/4277 398/135 |
| 2002/0110336 | A1 | 8/2002 | Dair et al. |
| 2002/0132524 | A1* | 9/2002 | Festag ................ G02B 6/4246 439/607.01 |
| 2007/0056769 | A1* | 3/2007 | Severance ............ H05K 9/0015 174/356 |

OTHER PUBLICATIONS

Wu et al., "Effective electromagnetic shielding of plastic packaging in low-cost optical transceiver modules," in Journal of Lightwave Technology, vol. 21, No. 6, pp. 1536-1543, Jun. 2003. doi: 10.1109/JLT.2003.810087.

* cited by examiner

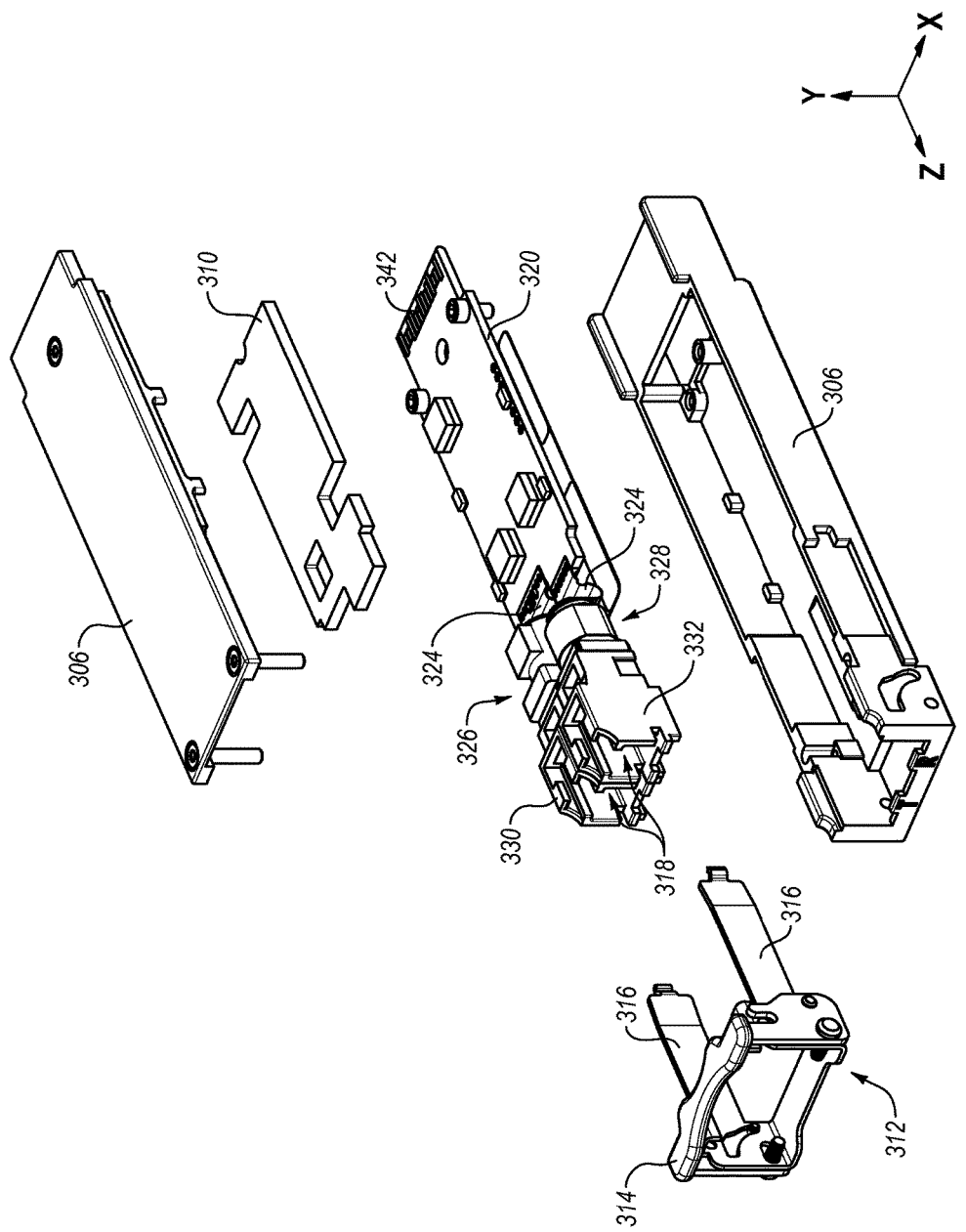

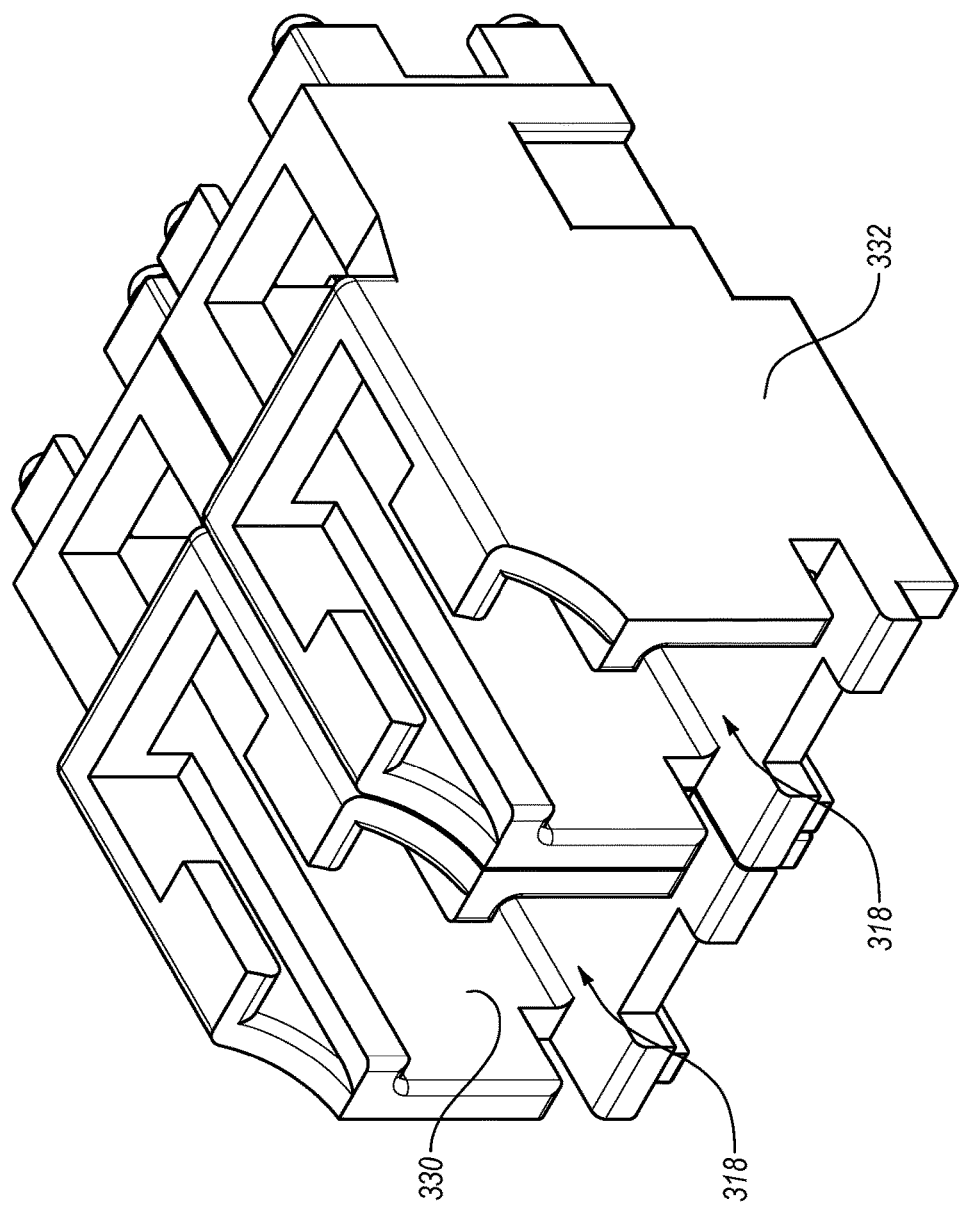

STRATEGIC PLACEMENT OF PLASTIC STRUCTURES FOR EMI MANAGEMENT OF TRANSCEIVER MODULE

BACKGROUND

Field

The present disclosure generally relates to optoelectronic modules. In particular, some embodiments relate to electromagnetic interference ("EMI") reduction and containment for optoelectronic modules.

Background

Communication modules, such as optoelectronic transceiver modules, may include various components that engage in the transmission and reception of optical signals. Some of the components may be housed within a shell of the optical transceiver module. Examples of such components may include a transmitter optical subassembly ("TOSA") and/or a receiver optical subassembly ("ROSA"). The optical transceiver module itself is operably received within a host device that serves as one component of a communications network.

To engage in optical communication with other communications modules, the optoelectronic transceiver module may operably connect with a connectorized optical fiber. The optoelectronic transceiver module may include a transmit port and/or a receive port configured to receive the connector of the optical fiber. Optical signals may be received and/or transmitted by the optoelectronic transceiver module via the optical fiber.

Optical signals received by the optoelectronic transceiver module may be converted to electrical signals. Conversely, the optoelectronic transceiver module may convert electrical signals to optical signals for transmission. During operation, components of the optoelectronic transceiver module may produce and emit electromagnetic fields, or electromagnetic interference ("EMI"), that may interfere with the operation of other components within and/or external to the optoelectronic transceiver module, particularly while the components operate at high frequencies.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

An example optoelectronic module may include a housing, a printed circuit board ("PCB"), at least one transmitter, at least one receiver, and at least one electromagnetic interference ("EMI") attenuating component. The housing may extend along a longitudinal axis between a first end portion and a second end portion. The first end portion may be configured to interface with at least one fiber optic cable including one or more optical fibers. The PCB may be positioned within the housing that includes an electrical connector at the second end portion of the housing. The transmitter may be positioned inside of the housing, electrically coupled to the PCB, and optically coupled with at least one of the one or more optical fibers. The receiver may be positioned inside of the housing, electrically coupled to the PCB, and optically coupled with at least another one of the one or more optical fibers. The EMI attenuating component may be formed of a plastic material that is configured to attenuate EMI. The EMI attenuating component may be configured to attenuate EMI generated by one or more other components of the optoelectronic module.

The EMI attenuating component may be an alignment guide received in an alignment guide receptacle defined by the housing. The alignment guide may be configured to receive a connector attached to the fiber optic cable. The EMI attenuating component may be an optoelectronic subassembly ("OSA") block retained by the housing. The OSA block may define a port configured to receive a ferrule attached to ends of the one or more optical fibers. The EMI attenuating component may be a moveable member of a latching mechanism configured to fasten or disengage the optoelectronic module from a host receptacle. The EMI attenuating component may be a PCB compression plate configured to retain the PCB with respect to the housing in at least one direction transverse to the longitudinal axis. The EMI attenuating component may be a PCB spacer. The PCB spacer may be positioned between the PCB and a second PCB in a double-deck PCB arrangement. The EMI attenuating component may be an adapter operably connected between the fiber optic cable and one or more components within the housing. The EMI attenuating component may be a flex EMI absorber positioned within the housing proximate the first end portion in a flex region of the optoelectronic module and may be configured to attenuate EMI emitted in the flex region. The EMI attenuating component may be a socket EMI absorber positioned within the housing proximate the electrical connector of the PCB positioned at the second end portion of the housing, the socket EMI absorber configured to attenuate EMI generated in a socket region. The EMI attenuating component may be a three-dimensional EMI absorber positioned between the PCB and one or both of a transmitter optical subassembly ("TOSA") and a receiver optical subassembly ("ROSA"). The EMI attenuating component may be a port retention bar positioned inside of the housing. The port retention bar may be configured to support one or both of a TOSA and ROSA. The EMI attenuating component may be a fiber tray supporting one or more internal optical cables positioned inside of the housing.

Another example optoelectronic module may include a housing, a PCB, at least one transmitter, at least one receiver, and at least one EMI attenuating component. The housing extends along a longitudinal axis between a first end portion and a second end portion. The first end portion may be configured to interface with at least one fiber optic cable including one or more optical fibers. The PCB may be positioned within the housing that includes an electrical connector at the second end portion of the housing. The transmitter may be positioned inside of the housing, electrically coupled to the PCB, and optically coupled with at least one of the one or more optical fibers. The receiver may be positioned inside of the housing, electrically coupled to the PCB, and optically coupled with at least another one of the one or more optical fibers. The EMI attenuating component may be formed of a plastic material that is configured to attenuate EMI. The EMI attenuating component may be configured to attenuate EMI generated by one or more other components of the optoelectronic module. The EMI attenuating component may be a flex EMI absorber positioned within the housing proximate the first end portion in a flex region of the optoelectronic module and configured to attenuate EMI emitted in the flex region.

An example method includes forcing a molten plastic material that includes nickel-coated carbon fiber or electrically conductive filler into a mold cavity of a mold and solidifying the molten plastic material that includes the nickel-coated carbon fiber or electrically conductive filler into a shape that conforms to a contour of the mold to form an EMI attenuating component of an optoelectronic module from the plastic material that includes the nickel-coated carbon fiber or electrically conductive filler.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the concepts will be set forth in the following description, and in part will be obvious from the description, or may be learned by the practice of the embodiments. The features and advantages of the embodiments may be realized and obtained by means of the instruments and combinations particularly pointed out in the appended claims. These and other features of the embodiments will become more fully apparent from the following description and appended claims, or may be learned by the practice of the embodiments as set forth hereinafter.

BRIEF DESCRIPTION OF THE DRAWINGS

Example embodiments will be described and explained with additional specificity and detail through the use of the accompanying drawings in which:

FIG. 10 is an exploded view of the optoelectronic module of FIGS. 9A-9B;

FIG. 11 is a perspective view of example OSA blocks of the optoelectronic module of FIGS. 9A-9B;

DETAILED DESCRIPTION

Figure 1A:
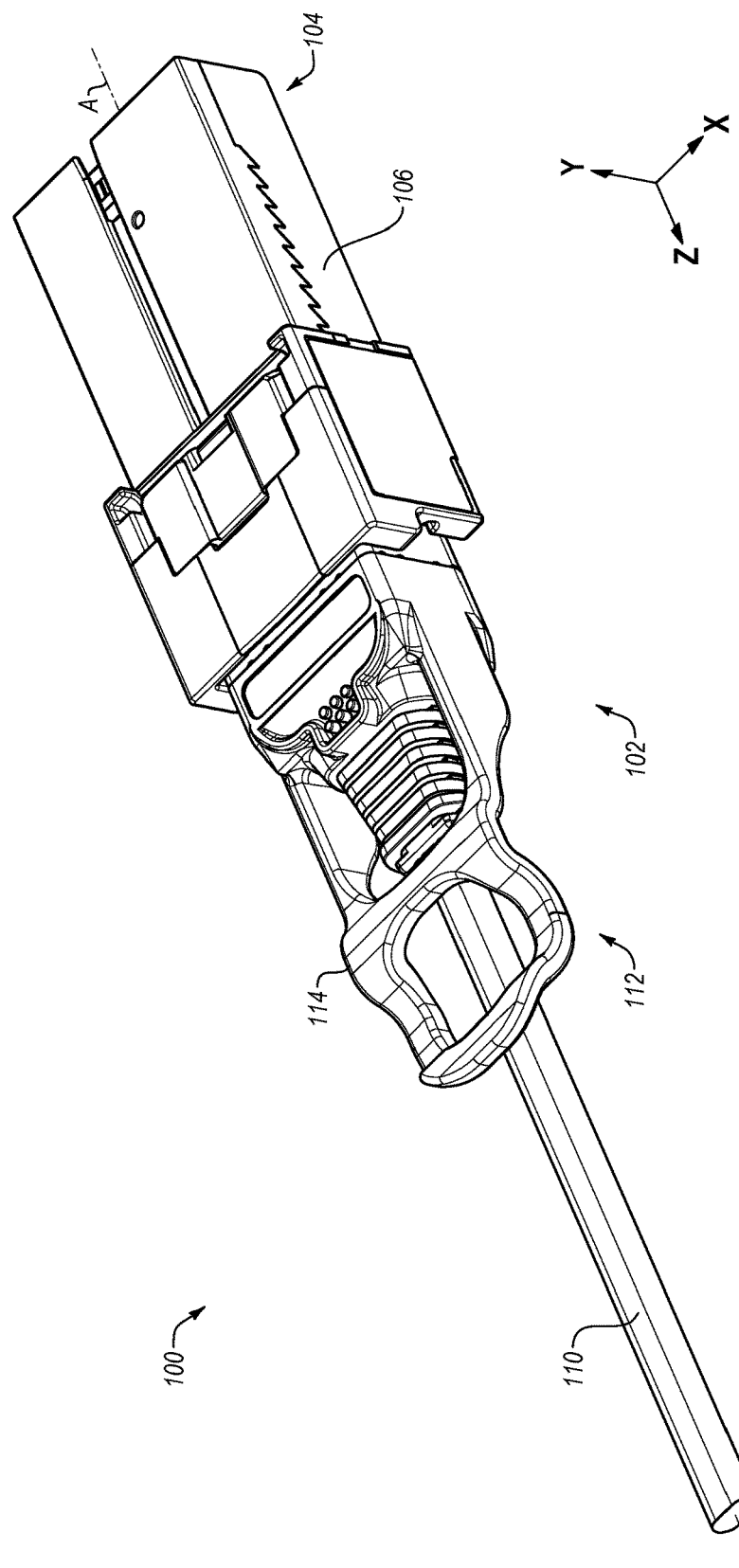
FIGS. 1A and 1B are perspective views of an example optoelectronic module.

Particular embodiments of the present disclosure will be described with reference to the accompanying drawings. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of configurations, all of which are explicitly contemplated herein.

The present disclosure generally relates to optoelectronic modules. In particular, some embodiments relate to electromagnetic interference ("EMI") reduction and containment for optoelectronic modules. Some optoelectronic modules include EMI absorbers that are traditionally manufactured by transfer molding. However, such EMI absorbers may be expensive and there may be difficulties associated with molding complicated three-dimensional features.

In some aspects, the embodiments described herein may be formed by injection molded EMI plastic. As used in this disclosure, EMI plastic may refer to a plastic material that is able to absorb, attenuating, and/or attenuate EMI. One example of an EMI plastic is a plastic with nickel coated carbon fiber, although other materials are contemplated, such as stainless steel fillers, carbon fillers, or any filler made of electrically conductive material. In another example, an EMI plastic may include a combination of nickel coated carbon fiber and stainless steel. In some circumstances, the materials and/or process of formation of the EMI plastic may depend on the desired amount attenuation and/or desired frequencies to be attenuated.

Embodiments employing the concepts of this disclosure may be relatively less expensive to manufacture than traditional optoelectronic modules with EMI absorbers. This may decrease the costs of manufacturing optoelectronic modules. Furthermore, the concepts of this disclosure may facilitate forming portions of optoelectronic modules with more complicated three-dimensional shapes. This may allow optoelectronic module designers flexibility in designing structures for EMI absorption in optoelectronic modules. Additionally, the concepts of this disclosure may facilitate formation of optoelectronic modules with improved EMI absorption as compared to traditional EMI absorbers for optoelectronic modules. The concepts described herein may also provide various benefits including the ability to simplify manufacturing processes by simplifying assembly and the ability to rework components. Further, concepts described herein may be implemented without modifying the overall size and structure of existing products.

Although the embodiments are described in the context of optoelectronic modules used in the field of optical networking, it will be appreciated that embodiments of the invention may be employed in other fields and/or operating environments where the functionality disclosed herein may be useful. Accordingly, the scope of the invention should not be construed to be limited to the exemplary implementations and operating environments disclosed herein.

Figure 1B:
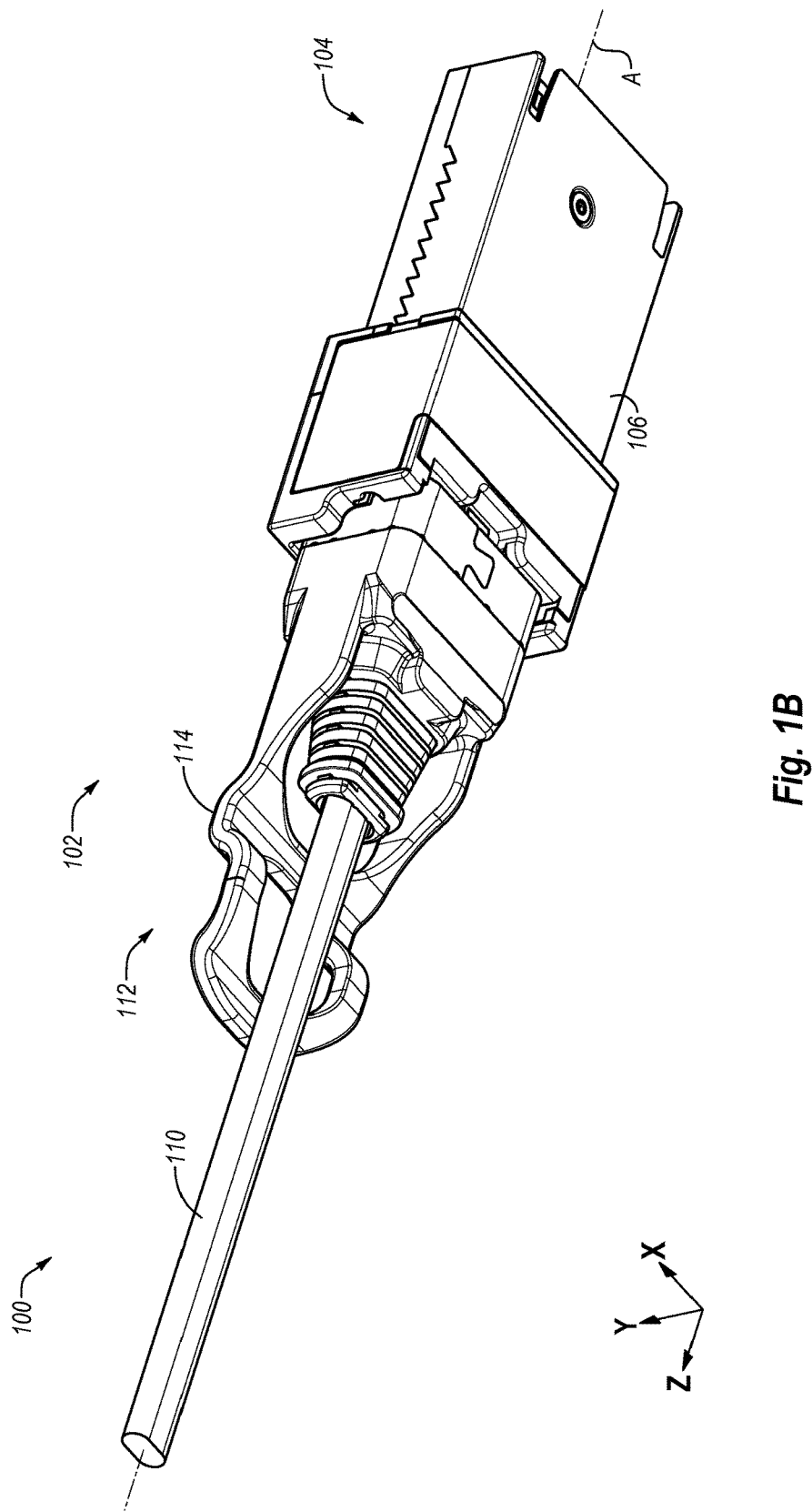

FIGS. 1A-1B, 2, 3A-3B, and 4 illustrate views of an example embodiment of an optoelectronic module 100. FIGS. 1A and 1B are perspective views of the optoelectronic module 100. As illustrated, the optoelectronic module 100 may include a housing 106 that extends along a longitudinal axis A of the optoelectronic module 100 between a first end portion 102 and a second end portion 104 of the optoelectronic module 100. The longitudinal axis A may extend in substantially the Z-direction of the arbitrarily defined Cartesian coordinate system of FIGS. 1A-1B, 2, and 3A-3B. The first end portion 102 of the optoelectronic module 100 is configured to interface with a fiber optic cable 110 including one or more optical fibers. In the illustrated configuration, the fiber optic cable 110 extends in the Z direction and is coupled to the first end portion 102.

The optoelectronic module 100 may be permanently attached to the fiber optic cable 110, and thus the optoelectronic module 100 represents one end of an "active cable" which may include another optoelectronic module permanently attached to the other end of the fiber optic cable 110. It is understood, however, the fiber optic cable 110 could instead be releasably connected to the optoelectronic module 100, in which case the optoelectronic module 100 would function as a stand-alone module. In some embodiments, the fiber optic cable 110 is a multichannel fiber-optic communication cable that includes twenty-four (24) fibers, twelve (12) of which are employed to transfer data signals in one direction, and twelve (12) of which are employed to transfer data signals in the opposite direction.

The optoelectronic module 100 can be configured for optical signal transmission and reception at a variety of per-second data rates including, but not limited to, 150 gigabits per second (Gb/s) or higher. In addition, although the example optoelectronic module 100 is configured to be substantially compliant with the CXP multisource agreement (MSA), the optoelectronic module 100 can instead be configured to assume a variety of different form factors that are substantially compliant with various transceiver and/or transponder MSAs including, but not limited to, C form-factor pluggable (CFP), small form factor (SFF), small form-factor pluggable (SFP), 10 Gigabit small form factor pluggable (XFP), XPAK, X2, XENPAK, or quad small form-factor pluggable (QSFP).

The optoelectronic module 100 may be designed to be plugged into a larger electronic system such as a printed circuit board ("PCB") of a host device or the like. For example, the optoelectronic module 100 includes a latching mechanism 112 with a handle 114 that may be operated to fasten and/or release the optoelectronic module 100 with respect to other components. In some configurations, the latching mechanism 112 may include a slider operably connected to a cam and configured to cause the cam to rotate about an axis of rotation to displace an end of a latch to disengage the latch from a host receptacle. Once mounted to a host PCB, the optoelectronic module 100 may be configured to communicate data between the host device and a network, for example.

The optoelectronic module 100 may convert electrical signals to optical signals representing the electrical signals and vice versa. For example, data in the form of optical signals may be communicated from a network along the fiber optic cable 110 to the optoelectronic module 100. Components of the optoelectronic module 100 may convert the optical signals to electrical signals representative of the optical signals. The electrical signals may then be communicated to the host device. Likewise, the host device may communicate electrical signals to the optoelectronic module 100. The optoelectronic module 100 may convert the electrical signals to optical signals representative of the electrical signals. The optical signals may be communicated along the fiber optic cable 110 into the network to, e.g., another optoelectronic module 100.

Figure 2:
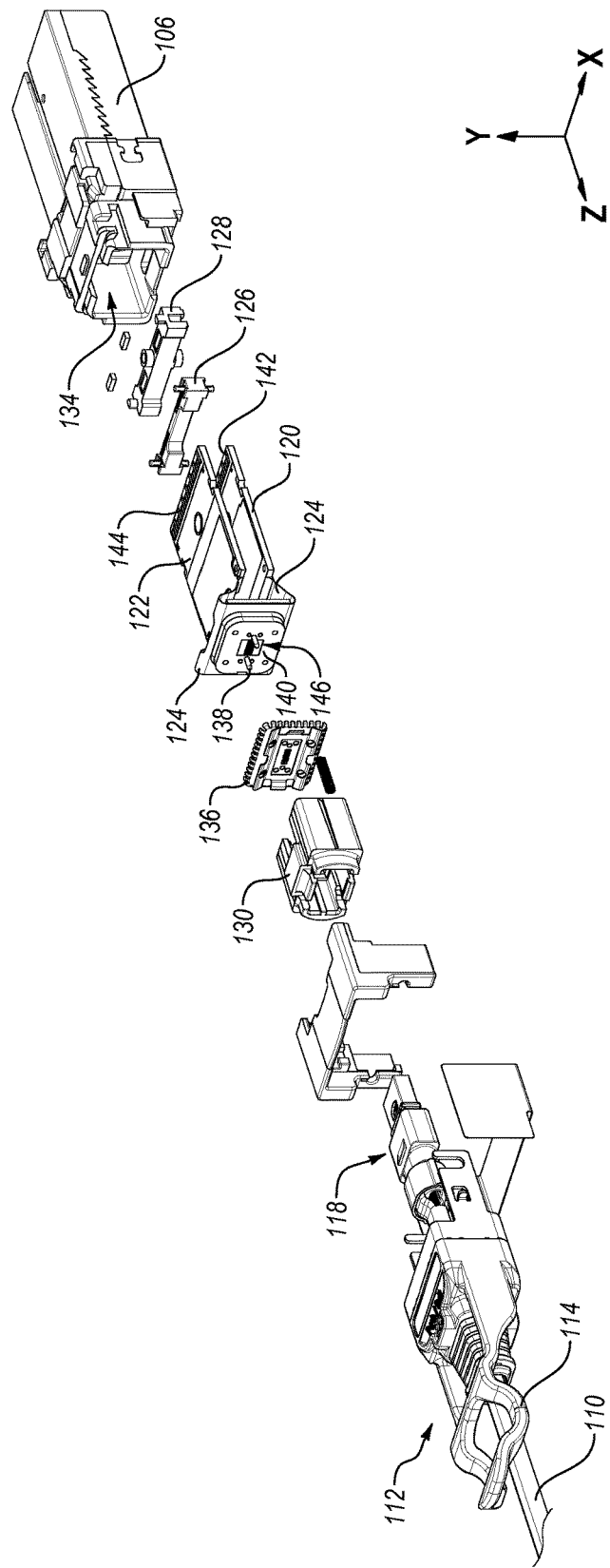
FIG. 2 is an exploded view of the optoelectronic module of FIGS. 1A-1B.

FIG. 2 is an exploded view of the optoelectronic module 100. The housing 106 may generally surround a PCB 120 having an electrical connector such as an edge connector 142 and a second PCB 122 having an electrical connector such as an edge connector 144. Although the illustrated configuration includes two PCBs 120 and 122, in other configurations the optoelectronic module 100 may include more or less PCBs. The PCBs 120 and 122 may be electrically coupled to a mounting plate 140 via electrical connectors 124, such as electrical flex. The mounting plate 140 may include an array 146 and alignment pins 138. The array 146 may include a transmitter array, a receiver array, or both. The array 146 may include receivers that convert optical signals to electrical signals representative of the optical signals and/or transmitters that convert electrical signals to optical signals representative of the electrical signals.

In the illustrated configuration, the optoelectronic module 100 includes a connector 118 that connects to the optical fibers of the fiber optic cable 110. The connector 118 may be permanently attached to the fiber optic cable 110 and an alignment guide 130. The alignment guide 130 may be configured to be permanently received within an alignment guide receptacle 134 of the housing 106. An electron magnetic resonance ("EMR") containment assembly 136 may be positioned between the mounting plate 140 and the alignment guide 130. The alignment pins 138 may be configured to facilitate alignment of the alignment guide 130, the EMR containment assembly 136, the array 146 and/or the optical fibers of the fiber optic cable 110.

In operation, incoming optical data signals may travel from the fiber optic cable 110, through the connector 118, the alignment guide 130, the EMR containment assembly 136, and are received by the receivers of the array 146. The receivers of the array 146 then convert the incoming optical data signals into electrical data signals. These electrical data signals are then passed through the electrical connectors 124 to the PCB 120 and/or 122. After being refined by the receiver circuitry, these electrical data signals are then passed via the edge connector 142 and/or 144 to the host device to which the optoelectronic module 100 is communicatively coupled.

Similarly, outgoing electrical data signals may travel via the edge connector 142 and/or 144 from the host device into the PCB 120 and/or 122. Transmitter circuitry on the PCB 120 and/or 122 refines these electrical data signals before passing them along the electrical connectors 124 to the transmitters of the array 146. The transmitters of the array 146 convert these electrical data signals into optical data signals before transmitting them through the EMR containment assembly 136, the alignment guide 130, and the connector 118, and into the optical fibers of the fiber optic cable 110. In this manner, the host device to which the optoelectronic module 100 is communicatively coupled can communicate with a remote host device.

The array 146 may include an array of optical transmitters such as vertical cavity surface emitting lasers ("VCSELs"), or the like. The transmitters may be electrically coupled to the PCB 120 and/or 122 and optically coupled with at least one of the optical fibers of the fiber optic cable 110. Additionally or alternatively, the array 146 may include an array of optical receivers such as photodetectors, or the like. The receivers may be electrically coupled to the PCB 120 and/or 122 and optically coupled with at least one of the optical fibers of the fiber optic cable 110. For example, the array 146 may include a four (4) channel VCSEL array and/or a four (4) channel PIN photodetector array. In some embodiments, the array 146 may include only a transmitter array or receiver array, such that the optoelectronic module 100 becomes only an optical transmitter or receiver, respectively. Alternately, the optoelectronic module 100 may include only a single transmitter and a single receiver, rather than the array 146.

Figure 3A:
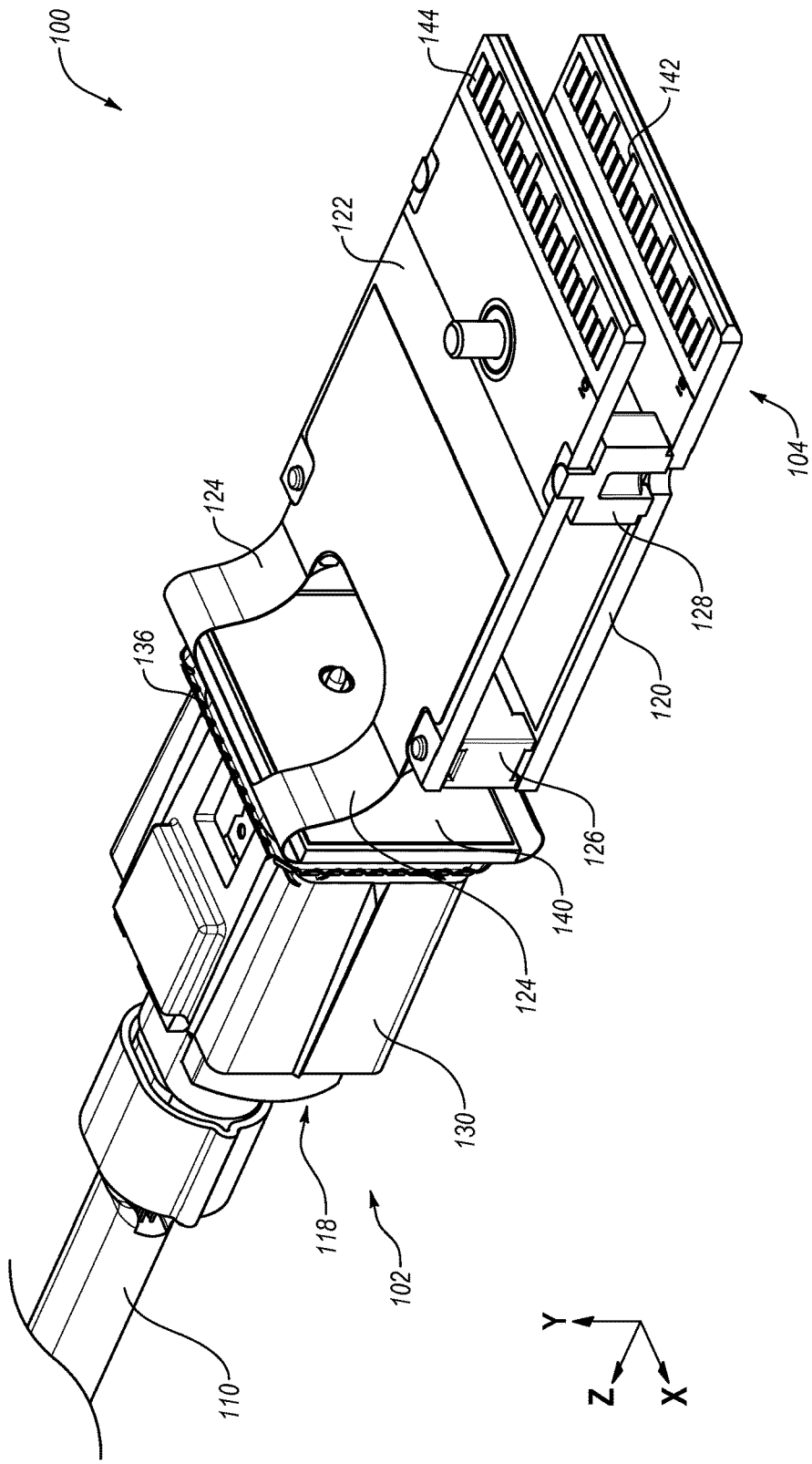
FIGS. 3A and 3B are perspective views of a portion of the optoelectronic module of FIGS. 1A-1B.
Figure 3B:
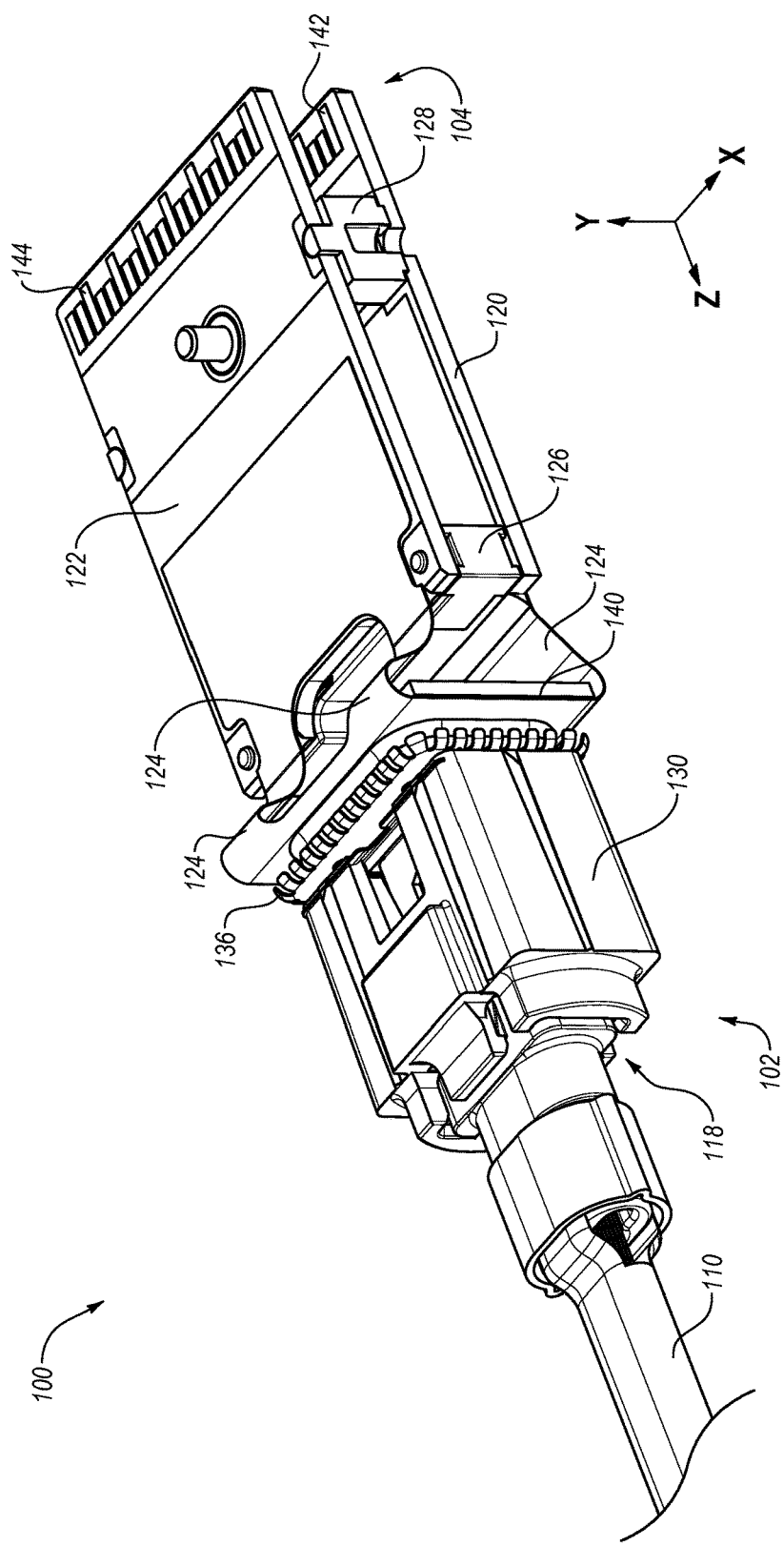

FIGS. 3A and 3B are perspective views of a portion of the optoelectronic module 100 to illustrate features inside of the housing 106. As illustrated, the optoelectronic module 100 may include PCB spacers 126 and 128 positioned between the PCB 120 and the PCB 122. Such configurations may be referred to as a double-deck PCB arrangement. The PCB spacers 126, 128 may be configured to support the PCBs 120, 122 inside of the housing 106. For example, the PCB spacers 126, 128 may retain the PCBs 120, 122 against the housing 106 when the PCBs 120, 122 are positioned within the housing 106. Although the illustrated configuration includes two PCB spacers 126, 128, other configurations may include any suitable number of PCB spacers 126, 128. For example, one PCB spacer may be positioned between the PCBs 120, 122 to support the PCBs 120, 122 inside of the housing. In another example, more than two PCB spacers may be positioned between the PCBs 120, 122 to support the PCBs 120, 122 inside of the housing.

One or both of the PCB spacers 126, 128 may be EMI attenuating components formed of a plastic material that is configured to attenuate EMI. One or both of the PCB spacers 126, 128 may be at least partially formed of a plastic material filled with nickel coated carbon fiber and/or electrically conductive filler in some embodiments. One or both of the PCB spacers 126, 128 may be formed by injection molding. The PCB spacers 126, 128 may be EMI attenuating components configured to attenuate EMI generated by one or more other components of the optoelectronic module 100. For example, the PCB spacers 126, 128 may attenuate or shield EMI generated by components mounted on the PCBs 120, 122. Additionally or alternatively, the PCB spacers 126, 128 may attenuate or shield EMI generated at the edge connectors 142, 144 when they are connected to a socket of the host PCB and/or components mounted on the mounting plate 140. Additionally or alternatively, the PCB spacer 128 may attenuate or shield EMI generated from the host PCB that could penetrate into the optoelectronic module 100 and interfere with the operation of the PCB 120 and 122.

Figure 4:
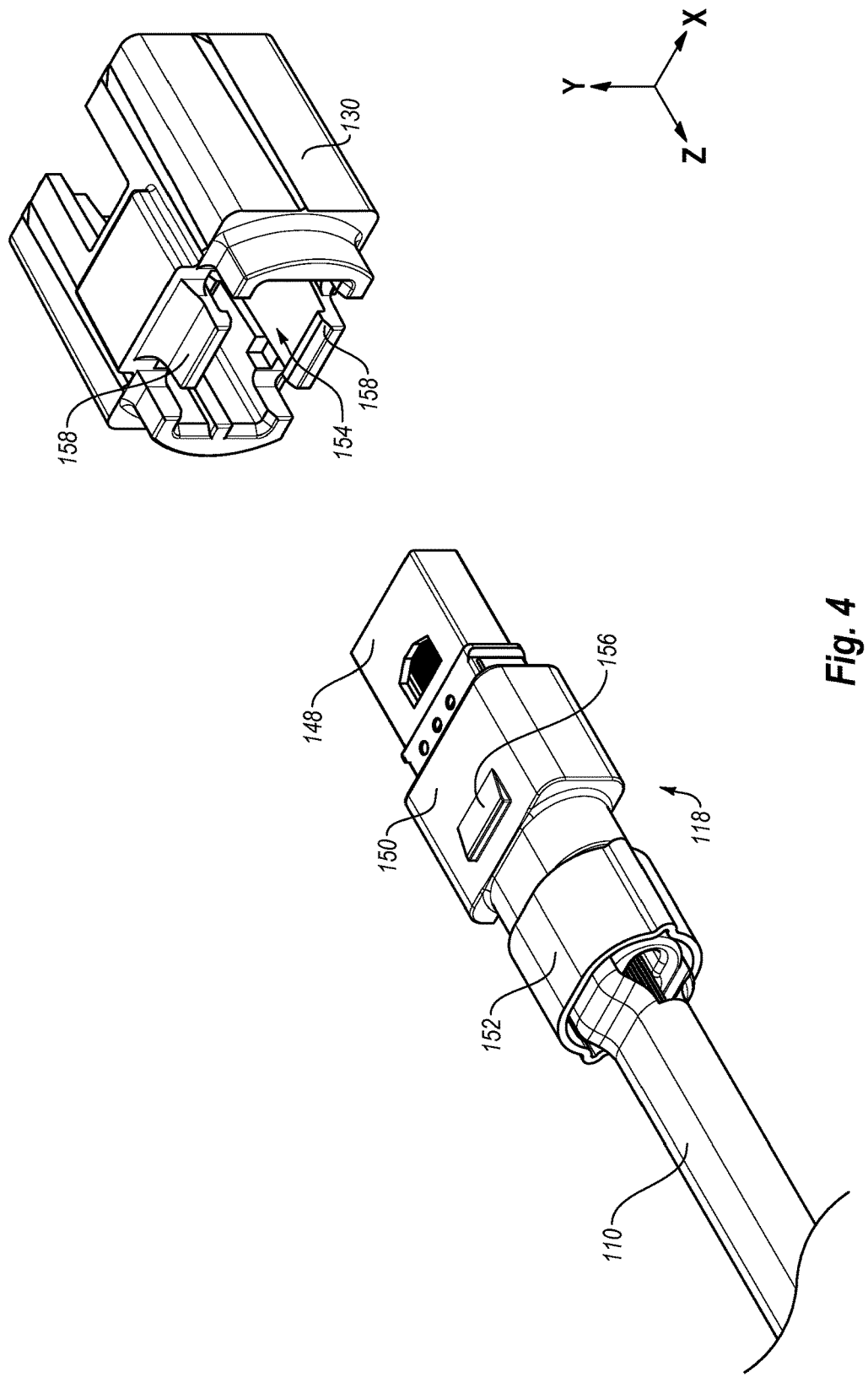
FIG. 4 is an exploded view of a portion of the optoelectronic module of FIGS. 1A-1B.

FIG. 4 is an exploded view of a portion of the optoelectronic module 100 to illustrate the alignment guide 130 and the connector 118 in further detail. As illustrated, the connector 118 may be configured to retain ends of the one or more optical fibers of the fiber optic cable 110. The connector 118 may include a ferrule 148, a connector housing 150 and a crimp ring 152. The crimp ring 152 may secure the connector 118 to the fiber optic cable 110. The crimp ring 152 may be crimped to secure the fiber optic cable 110 to the connector 118. Alternately or additionally, epoxy, adhesive or other securing means can be employed to secure the connector 118 to the fiber optic cable 110. Although the ferrule 148 can include any one of a variety of different ferrules, in some embodiments, the ferrule 148 may include a mechanical transfer ("MT")-type ferrule. Alternately or additionally, the ferrule 148 may include a 24-optical fiber ferrule, e.g., the ferrule 148 may be adapted to be mounted upon and/or to ends of 24 optical fibers of the fiber optic cable 110.

The alignment guide 130 may define a passageway 154 sized and shaped to receive the connector 118 and engage the connector housing 150. The connector housing 150 may include a protrusion 156 configured to engage a corresponding engaging structure 158 of the alignment guide 130. A second protrusion may be positioned on the opposite side of the connector housing 150 from the protrusion 156 and may be configured to engage another engaging structure 158 of the alignment guide 130. The protrusion 156 may be configured to engage structures on the alignment guide 130 to permanently attach the connector 118, and thus the fiber optic cable 110, to the optoelectronic module 100. The connector housing 150 may include any suitable number of protrusions such as the protrusion 156. For example, the connector housing 150 may include a single protrusion, two protrusions, or more than two protrusions. Furthermore, the alignment guide 130 may include any suitable number of engaging structures that correspond to the protrusions, such as the engaging structure 158.

The alignment guide 130 may be configured to receive the connector 118 attached to the fiber optic cable 110 and to optically align the optical fibers of the fiber optic cable 110 with transmitters and/or receivers of the array 146. Specifically, the alignment guide 130 may be sized and shaped such that the optical fibers of the fiber optic cable 110 retained by the connector 118 are optically aligned with the transmitters and/or the receivers of the array 146 when the connector 118 is positioned in the passageway 154 and into engagement with the alignment guide 130. Once the protrusion 156 of the connector 118 engages the engaging structures 158 of the alignment guide 130, the connector 118 may be permanently or removably engaged with the alignment guide 130.

The alignment guide 130 may be an EMI attenuating component formed of a plastic material that is configured to attenuate EMI, e.g., EMI generated by elements of the array 146. The alignment guide 130 may be at least partially formed of a plastic material filled with nickel coated carbon fiber and/or electrically conductive filler in some embodiments. The alignment guide 130 may be formed by injection molding. The alignment guide 130 may be an EMI attenuating component configured to attenuate EMI generated by one or more other components of the optoelectronic module 100. For example, the alignment guide 130 may attenuate or shield EMI generated by circuits or electrical components proximate the array 146 of the optoelectronic module 100.

Figure 5A:
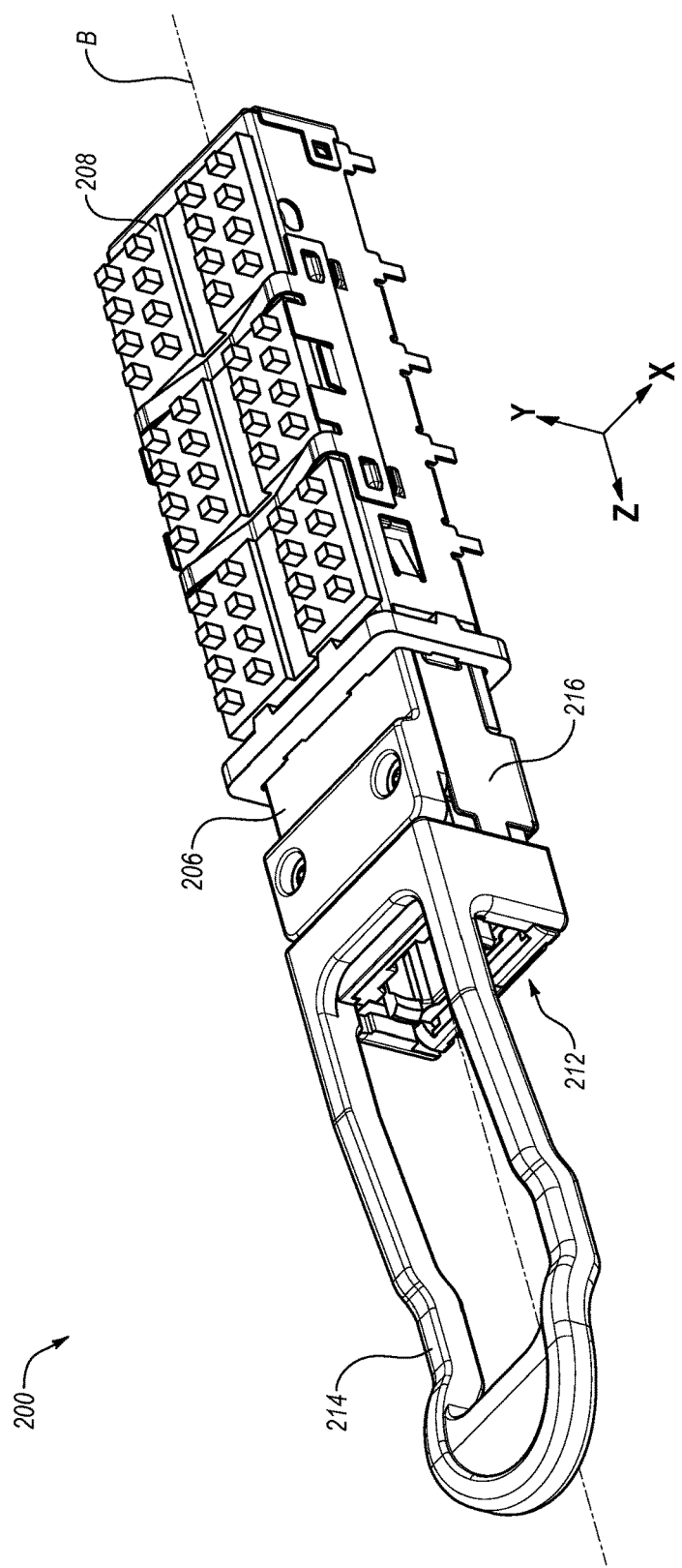
FIGS. 5A-5B are perspective views of another example optoelectronic module.
Figure 5B:
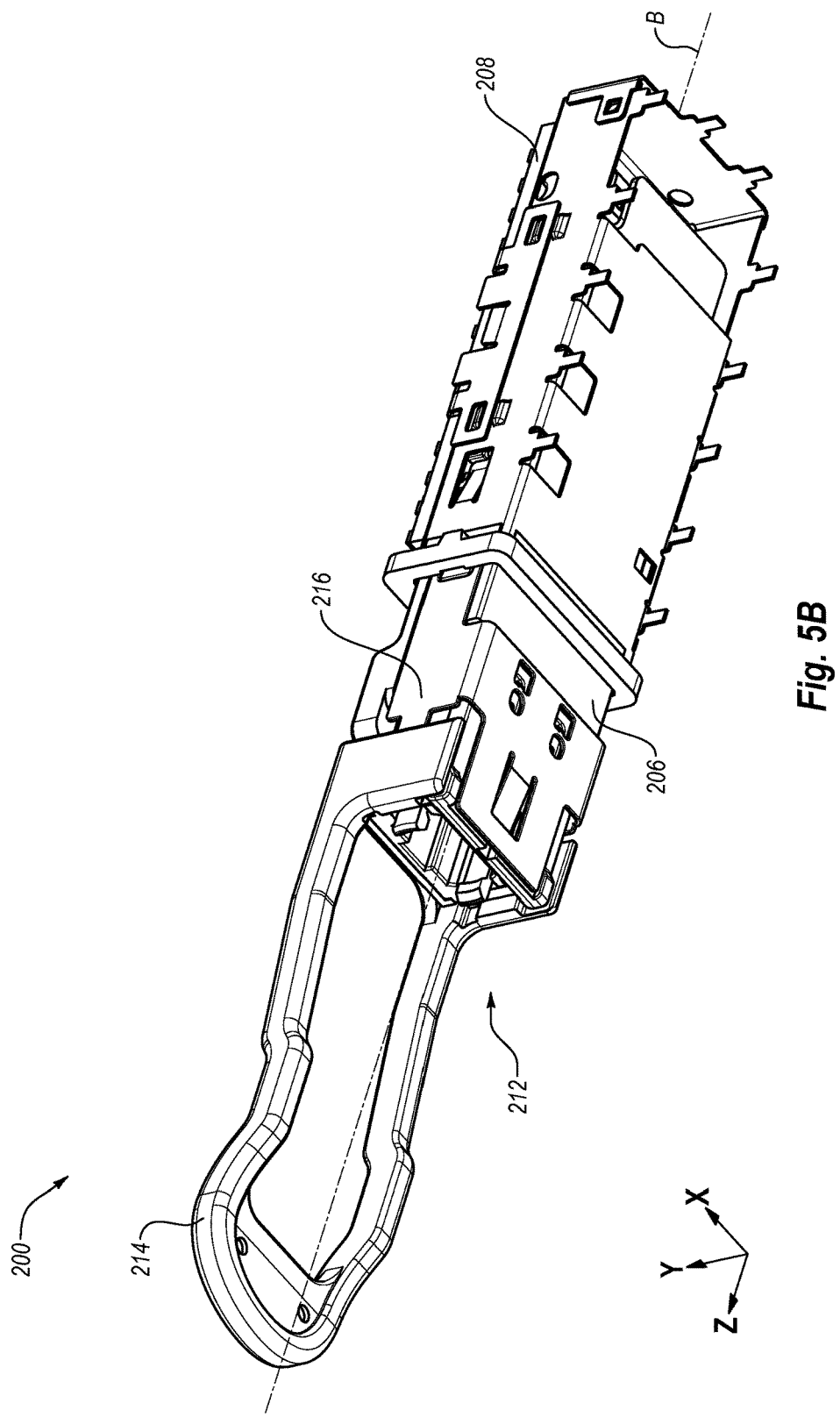

FIGS. 5A-5B, 6A-6B, 7 and 8 illustrate views of an example embodiment of another optoelectronic module 200. FIGS. 5A-5B are perspective views of the optoelectronic module 200. The optoelectronic module 200 may be designed to interface with a host receptacle 208. For example, the optoelectronic module 200 includes a latching mechanism 212 with a handle 214 that may be operated to fasten and/or release the optoelectronic module 200 with respect to the host receptacle 208. Once mounted inside of the host receptacle 208, as shown, the optoelectronic module 200 may be configured to communicate data in a network.

Figure 6A:
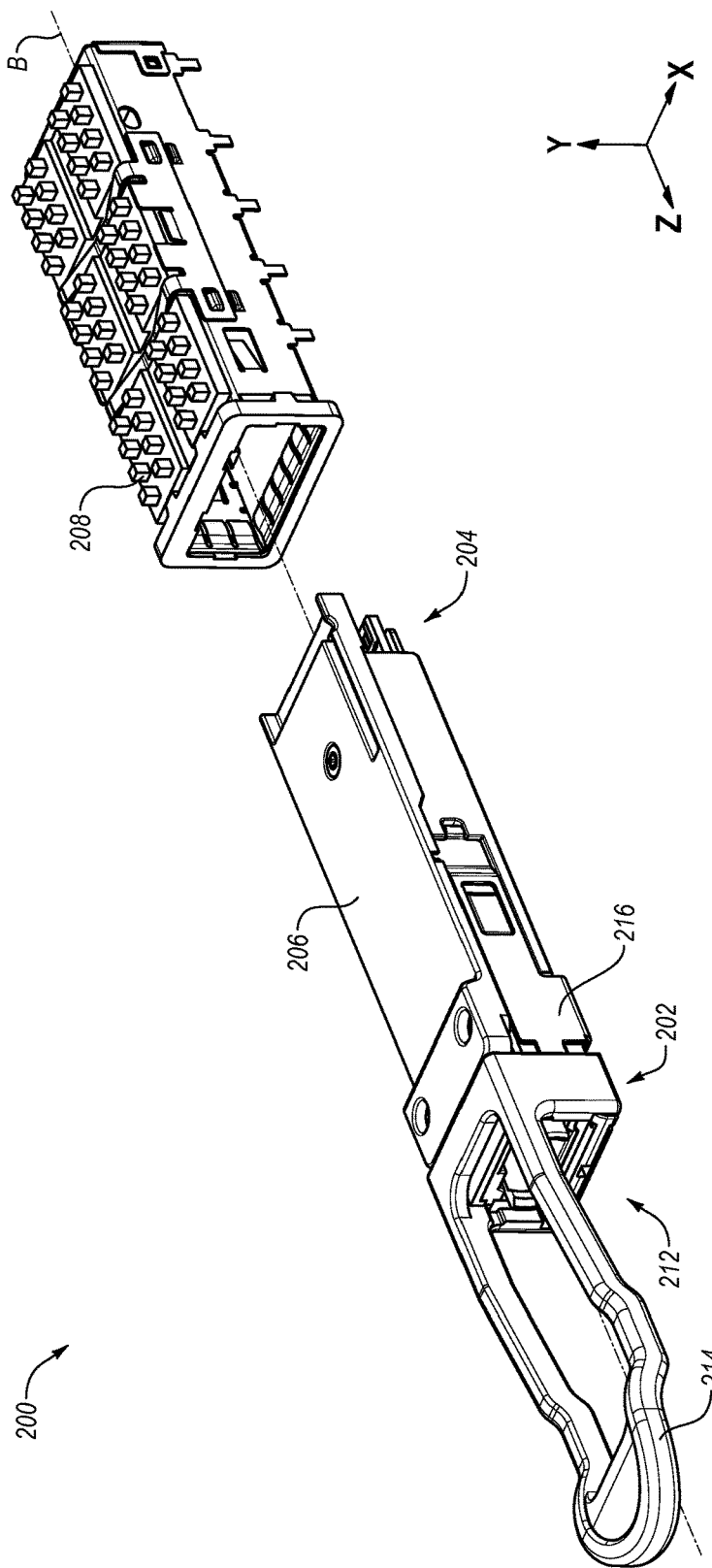
FIG. 6A is an exploded view of the optoelectronic module of FIGS. 5A-5B.
Figure 6B:
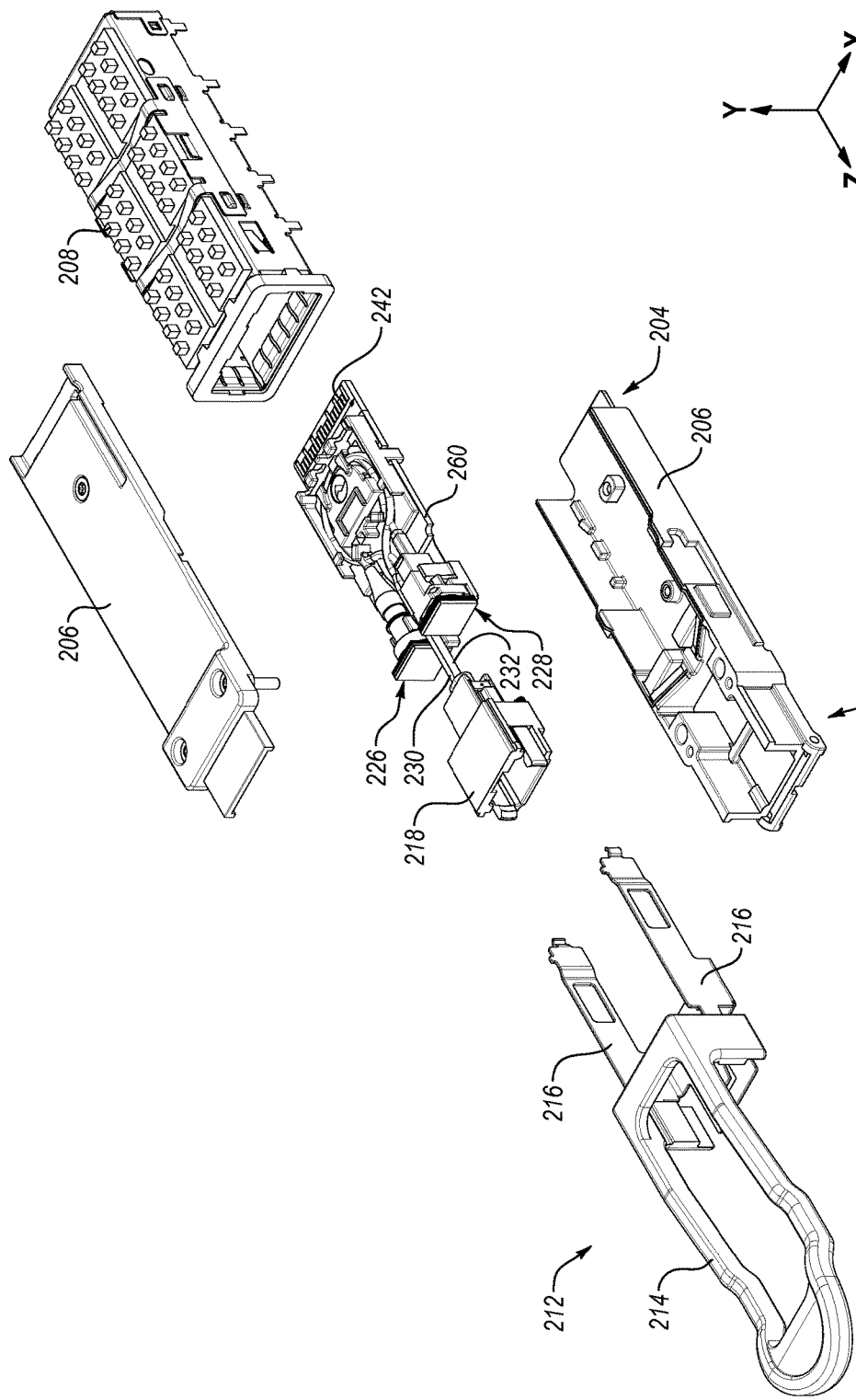
FIG. 6B is an exploded view of the optoelectronic module of FIGS. 5A-5B.

FIG. 6A is an exploded view of the optoelectronic module 200 outside of the host receptacle 208. FIG. 6B is an exploded view of the optoelectronic module 200. As illustrated in FIG. 6A, the optoelectronic module 200 may include a housing 206 that extends along a longitudinal axis B of the optoelectronic module 200 between a first end portion 202 and a second end portion 204 of the optoelectronic module 200. The longitudinal axis B may extend in substantially the Z-direction. The first end portion 202 of the optoelectronic module 200 is configured to interface with a fiber optic cable including one or more optical fibers.

Turning to FIG. 6B, the optoelectronic module 200 may include a port 218 positioned at the first end portion 202, retained by the housing 206, and configured to receive a fiber optic cable. In the illustrated configuration, the port 218 is sized and shaped to receive a fiber optic cable with twelve (12) optical fibers, although other configurations may be implemented.

The optoelectronic module 200 may include a transmitter optical subassembly ("TOSA") 226 and receiver optical subassembly ("ROSA") 228 positioned inside of the housing 206. Optical cables 230, 232 may optically couple the TOSA 226 and the ROSA 228 to the port 218, respectively. The TOSA 226 may include an array of transmitters and the ROSA 228 may include an array of receivers. In this example, each of the optical cables 230, 232 includes four (4) optical fibers, the TOSA 226 includes an array with four (4) transmitters, and the ROSA 228 includes an array with four (4) receivers. The TOSA 226 and/or the ROSA 228 may be electrically coupled to a PCB 220 with an electrical connector such as an edge connector 242 that is configured to be coupled with other components, such as a host device. As illustrated, a fiber tray 260 may be positioned inside of the housing 206 and may support the optical cables 230, 232, the TOSA 226 and/or the ROSA 228. Specifically, the fiber tray 260 may support the TOSA 226 and the ROSA 228 against the housing 206 as the TOSA 226 and the ROSA 228 are positioned inside of the housing 206.

The optoelectronic module 200 may convert electrical signals to optical signals representing the electrical signals and vice versa. For example, data in the form of optical signals may be communicated from a network along the fiber optic cable to the optoelectronic module 200. The ROSA 228 of the optoelectronic module 200 may convert the optical signals to electrical signals representative of the optical signals. The electrical signals may then be communicated to the host device. Likewise, the host device may communicate electrical signals to the optoelectronic module 200. The TOSA 226 of the optoelectronic module 200 may convert the electrical signals to optical signals representative of the electrical signals. The optical signals may be communicated along the fiber optic cable into the network to, e.g., another optoelectronic module 200.

The optoelectronic module 200 may be removably attached to the fiber optic cable, in which case the optoelectronic module 200 may include a stand-alone module. Although the example optoelectronic module 200 is configured to be substantially compliant with the QSFP MSA, the optoelectronic module 200 can instead be configured to assume a variety of different form factors that are substantially compliant with various transceiver and/or transponder MSAs including, but not limited to, SFF, SFP, XFP, XPAK, X2, XENPAK, or CXP.

As illustrated, for example, in FIG. 6A, the optoelectronic module 200 may be sized and shaped to interface with the host receptacle 208. The optoelectronic module 200 may be positioned at least partially inside of the host receptacle 208 along the Z-direction and the latching mechanism 212 may fasten and/or release the optoelectronic module 200 with respect to the host receptacle 208.

Figure 7:
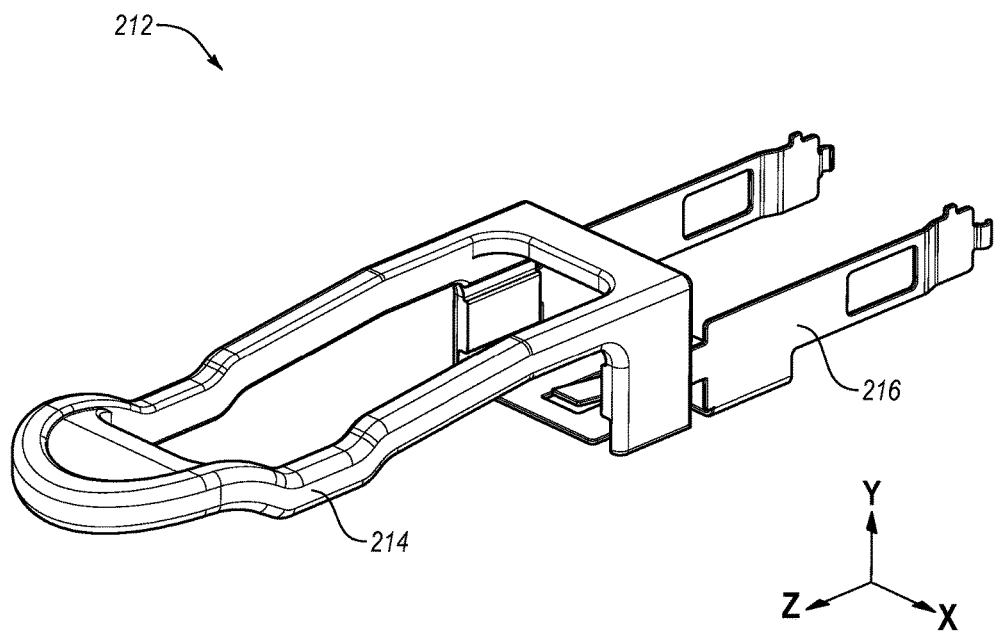
FIG. 7 is a perspective view of an example latching mechanism of the optoelectronic module of FIGS. 5A-5B.

FIG. 7 is a perspective view of the latching mechanism 212. As illustrated, the latching mechanism 212 may include a moveable member 216 operably coupled to the handle 214. In the illustrated configuration, the moveable member 216 is a slider extending in the Z-direction along the sides of the housing 206. As illustrated, for example, in FIGS. 5A-5B, the moveable member 216 secures the optoelectronic module 200 to the host receptacle 208 when it is positioned inside of the host receptacle 208. The handle 214 may be displaced to operate the moveable member 216 and release the optoelectronic module 200 from the host receptacle 208, thereby permitting the optoelectronic module 200 to be removed from the host receptacle 208 (see, for example, FIG. 6A).

The moveable member 216 may be an EMI attenuating component formed of a plastic material that is configured to attenuate EMI. The moveable member 216 may be at least partially formed of a plastic material filled with nickel coated carbon fiber and/or electrically conductive filler in some embodiments. The moveable member 216 may be formed by injection molding. The moveable member 216 may be an EMI attenuating component configured to attenuate EMI generated by one or more other components of the optoelectronic module 200. For example, the moveable member 216 may attenuate or shield EMI generated by circuitry inside the optoelectronic module 200.

Although a specific latching mechanism 212 with a specific moveable member 216 is illustrated, any suitable latching mechanism may include a moveable member that is an EMI attenuating component formed of a plastic material that is configured to attenuate EMI. For example, the latching mechanism 112 of the optoelectronic module 100 may include a moveable member, such as a slider, that is an EMI attenuating component formed of a plastic material that is configured to attenuate EMI in the optoelectronic module 100. Furthermore, the concepts described may be applied to any suitable latching mechanism and/or moveable member.

Figure 8:
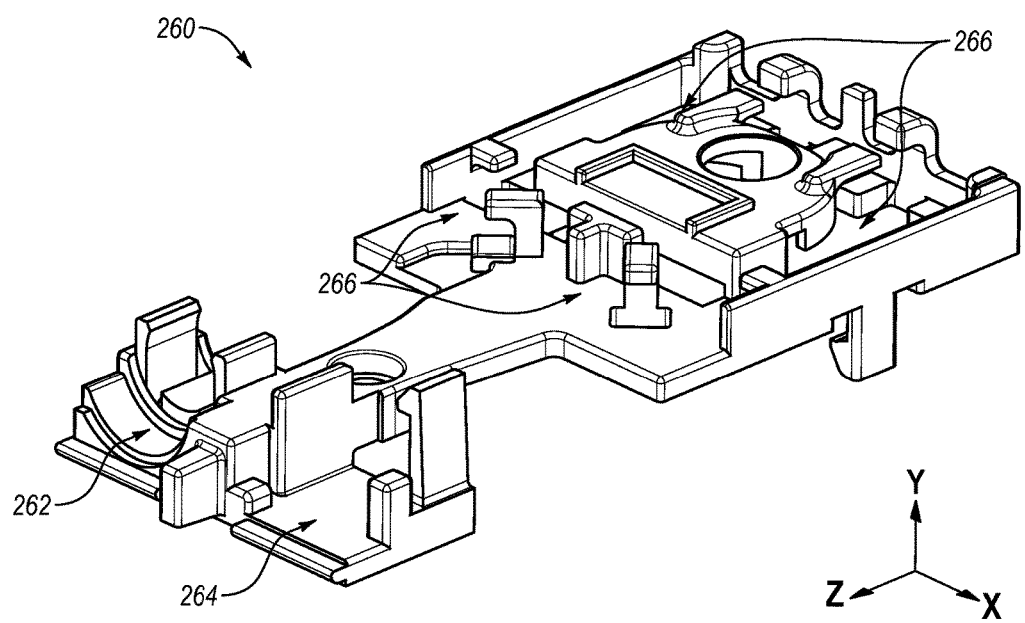
FIG. 8 is a perspective view of an example fiber tray of the optoelectronic module of FIGS. 5A-5B.

FIG. 8 is a perspective view of the fiber tray 260. As illustrated, the fiber tray 260 defines a TOSA receptacle 262 sized and shaped to receive and/or support at least a portion of the TOSA 226 and a ROSA receptacle 264 sized and shaped to receive and/or support at least a portion of the ROSA 228. The fiber tray 260 may also define a passageway 266 that receives the optical cables 230, 232 that loop through the inside of the housing 206 between the TOSA 226 and the port 218 and between the ROSA 228 and the port 218, respectively.

The fiber tray 260 may be an EMI attenuating component formed of a plastic material that is configured to attenuate EMI. The fiber tray 260 may be at least partially formed of a plastic material filled with nickel coated carbon fiber and/or electrically conductive filler in some embodiments. The fiber tray 260 may be formed by injection molding. The fiber tray 260 may be an EMI attenuating component configured to attenuate EMI generated by one or more other components of the optoelectronic module 200. For example, the fiber tray 260 may attenuate or shield EMI generated by the PCB 220 and/or electrical components on the PCB 220 of the optoelectronic module 200. In another example, the fiber tray 260 may attenuate EMI reflected within the housing 206.

Figure 9A:
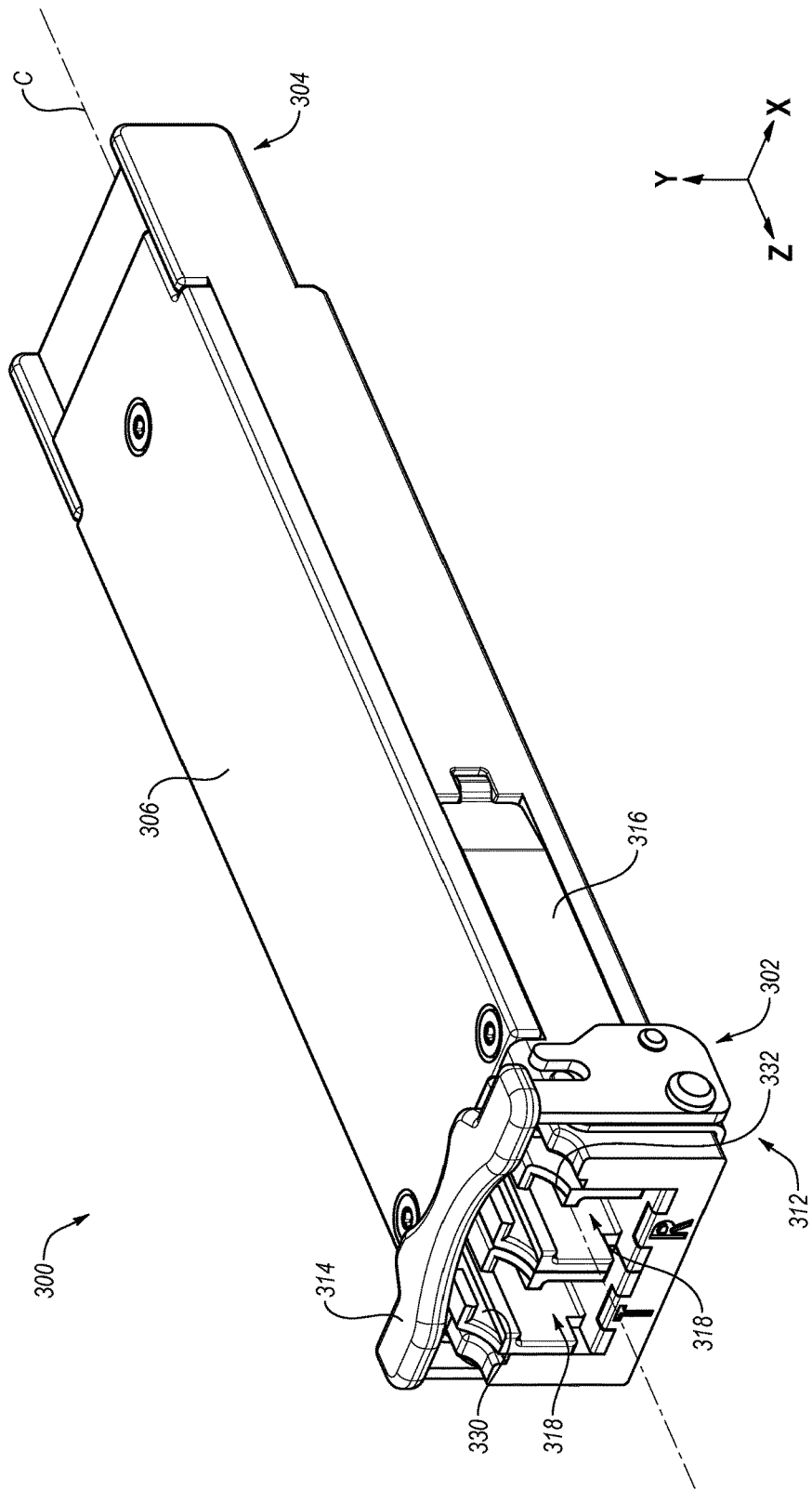
FIGS. 9A-9B are perspective views of another example optoelectronic module.
Figure 9B:
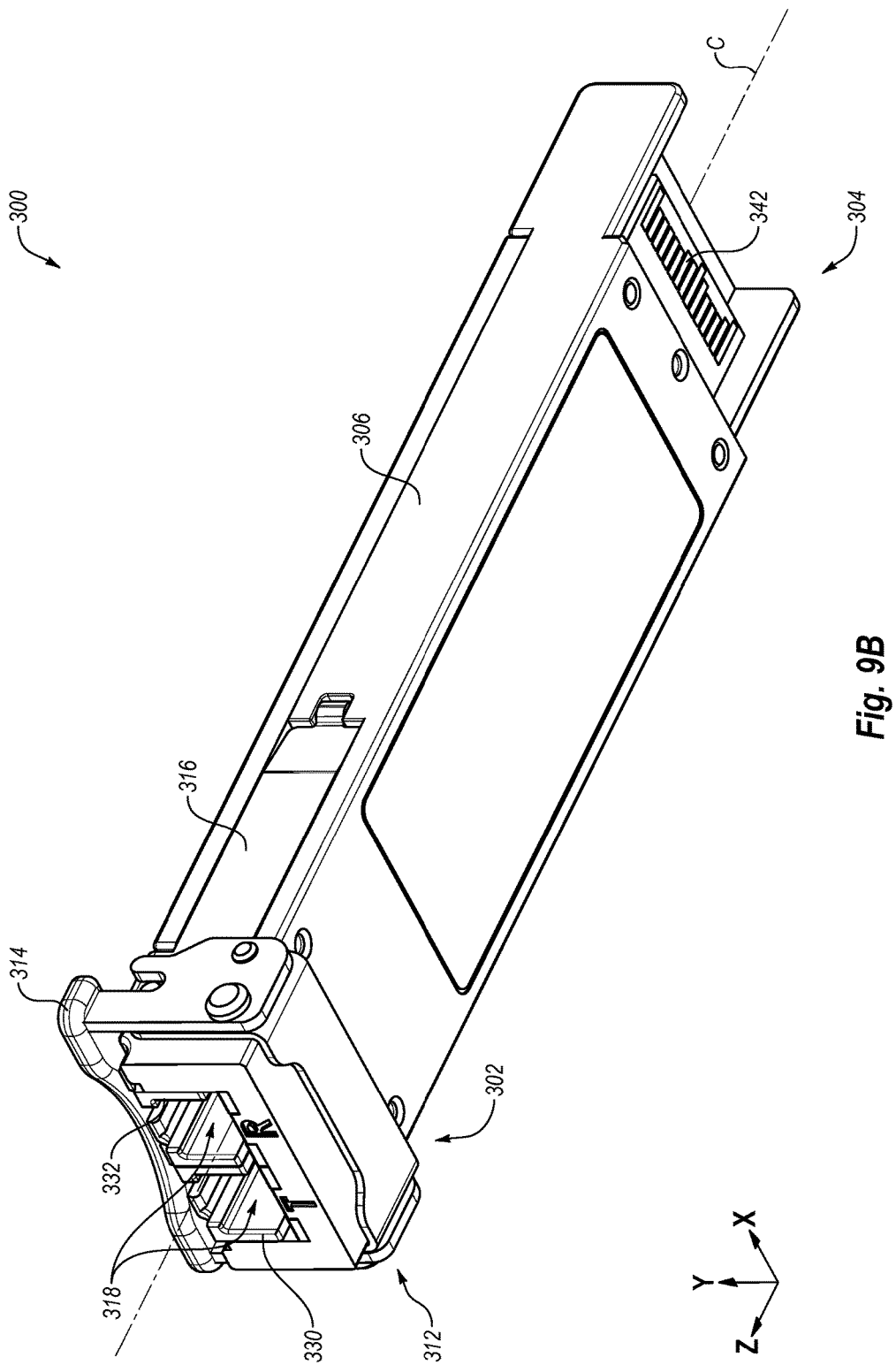

FIGS. 9A-9B, 10 and 11 illustrate views of an example embodiment of another optoelectronic module 300. FIGS. 9A-9B are perspective views of the optoelectronic module 300. As illustrated, the optoelectronic module 300 may include a housing 306 that extends along a longitudinal axis C of the optoelectronic module 300 between a first end portion 302 and a second end portion 304 of the optoelectronic module 300. The longitudinal axis C may extend in substantially the Z-direction. The first end portion 302 of the optoelectronic module 300 is configured to interface with two fiber optic cables, each including one or more optical fibers.

The optoelectronic module 300 may be designed to be plugged into a larger electronic system such as a PCB of a host device or the like. For example, the optoelectronic module 300 includes a latching mechanism 312 with a handle 314 that may be operated to fasten and/or release the optoelectronic module 300 with respect to other components. As illustrated in FIG. 9B, the optoelectronic module 300 may include an electrical connector such as an edge connector 342 configured to electrically couple the optoelectronic module 300 to a host PCB.

In some configurations, the latching mechanism 312 may include a moveable member 316 operably coupled to the handle 314. In the illustrated configuration, the moveable member 316 is a slider extending in the Z-direction along the sides of the housing 306. The moveable member 316 may secure the optoelectronic module 300 to a host receptacle when it is positioned inside of the host receptacle. The handle 314 may be displaced to operate the moveable member 316 and release the optoelectronic module 300 from the host receptacle, thereby permitting the optoelectronic module 300 to be removed from the host receptacle.

The optoelectronic module 300 may include ports 318 positioned at the first end portion 302, each configured to receive a fiber optic cable. In some configurations, the ports 318 may be configured to receive a ferrule attached to ends of one or more optical fibers. Once mounted to a host PCB and coupled with fiber optic cables, the optoelectronic module 300 may be configured to communicate data between the host device and a network, for example. As illustrated, the ports 318 may be defined by OSA blocks 330 and 332. The OSA blocks 330 and 332 may be retained by the housing 306.

FIG. 10 is an exploded view of the optoelectronic module 300. As illustrated, the optoelectronic module 300 may include a TOSA 326 and ROSA 328 positioned inside of the housing 306. The TOSA 326 may include one or more transmitters and the ROSA 328 may include one or more receivers. The OSA blocks 330 and 332 may be configured to align respective optical cables with the TOSA 326 and/or the ROSA 328. The optoelectronic module 300 may include a PCB 320 generally surrounded by the housing 306. The TOSA 326 and/or the ROSA 328 may be electrically coupled to the PCB 320 by electrical connectors 324, such as electrical flex. In the illustrated configuration, the edge connector 342 is included in the PCB 320, although other implementations are possible.

The optoelectronic module 300 may convert electrical signals to optical signals representing the electrical signals and vice versa. For example, data in the form of optical signals may be communicated from a network along the fiber optic cable to the optoelectronic module 300. The ROSA 328 of the optoelectronic module 300 may convert the optical signals to electrical signals representative of the optical signals. The electrical signals may then be communicated to the host device. Likewise, the host device may communicate electrical signals to the optoelectronic module 300. The TOSA 326 of the optoelectronic module 300 may convert the electrical signals to optical signals representative of the electrical signals. The optical signals may be communicated along the fiber optic cable into the network to, e.g., another optoelectronic module 300.

The optoelectronic module 300 may be removably attached to fiber optic cables, in which case the optoelectronic module 300 may be a stand-alone module. Although the example optoelectronic module 300 is configured to be substantially compliant with the XFP MSA, the optoelectronic module 300 can instead be configured to assume a variety of different form factors that are substantially compliant with various transceiver and/or transponder MSAs including, but not limited to, SFF, SFP, QSFP, XPAK, X2, XENPAK, or CXP.

FIG. 11 is a perspective view of the OSA blocks 330 and 332. As illustrated, the OSA blocks 330 and 332 define the ports 318 configured to receive fiber optic cables. The OSA blocks 330 and 332 may be encased in the housing. The OSA blocks 330 and 332 may retain and align optical fibers with the TOSA 326 and/or the ROSA 328. The OSA blocks 330 and 332 may be exposed on the side that receives the optical fibers. In some configurations, the OSA blocks 330 and 332 may be integrated in a single integral component.

The OSA blocks 330 and 332 may be EMI attenuating components formed of a plastic material that is configured to attenuate EMI. The OSA blocks 330 and 332 may be at least partially formed of a plastic material filled with nickel coated carbon fiber and/or electrically conductive filler in some embodiments. The OSA blocks 330 and 332 may be formed by injection molding. The OSA blocks 330 and 332 may be EMI attenuating components configured to attenuate EMI generated by one or more other components of the optoelectronic module 300. For example, the OSA blocks 330 and 332 may attenuate or shield EMI generated by the TOSA 326, the ROSA 328, the electrical connectors 324, the PCB 320, and/or components mounted to the PCB 320 of the optoelectronic module 300.

Figure 12A:
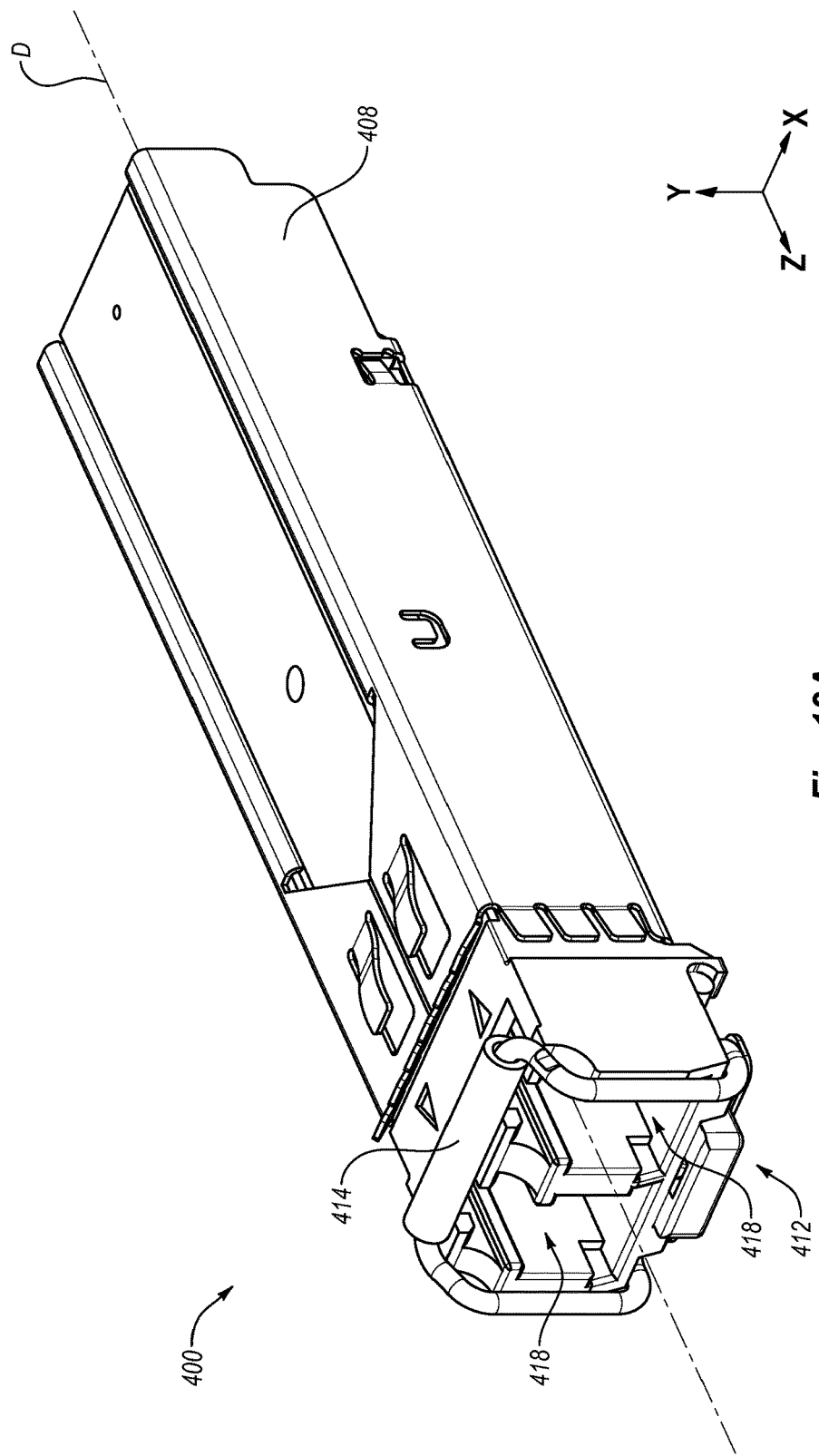
FIGS. 12A-12B are perspective views of another example optoelectronic module.

FIGS. 12A-12B and 13A-13B illustrate views of an example embodiment of another optoelectronic module 400. FIG. 12A is a perspective view of the optoelectronic module 400 and an enclosure 408. The optoelectronic module 400 may be designed to interface with a host receptacle. For example, the optoelectronic module 400 includes a latching mechanism 412 with a handle 414 that may be operated to fasten and/or release the optoelectronic module 400 with respect to the host receptacle. Once mounted inside of the host receptacle, the optoelectronic module 400 may be configured to communicate data in a network.

Figure 12B:
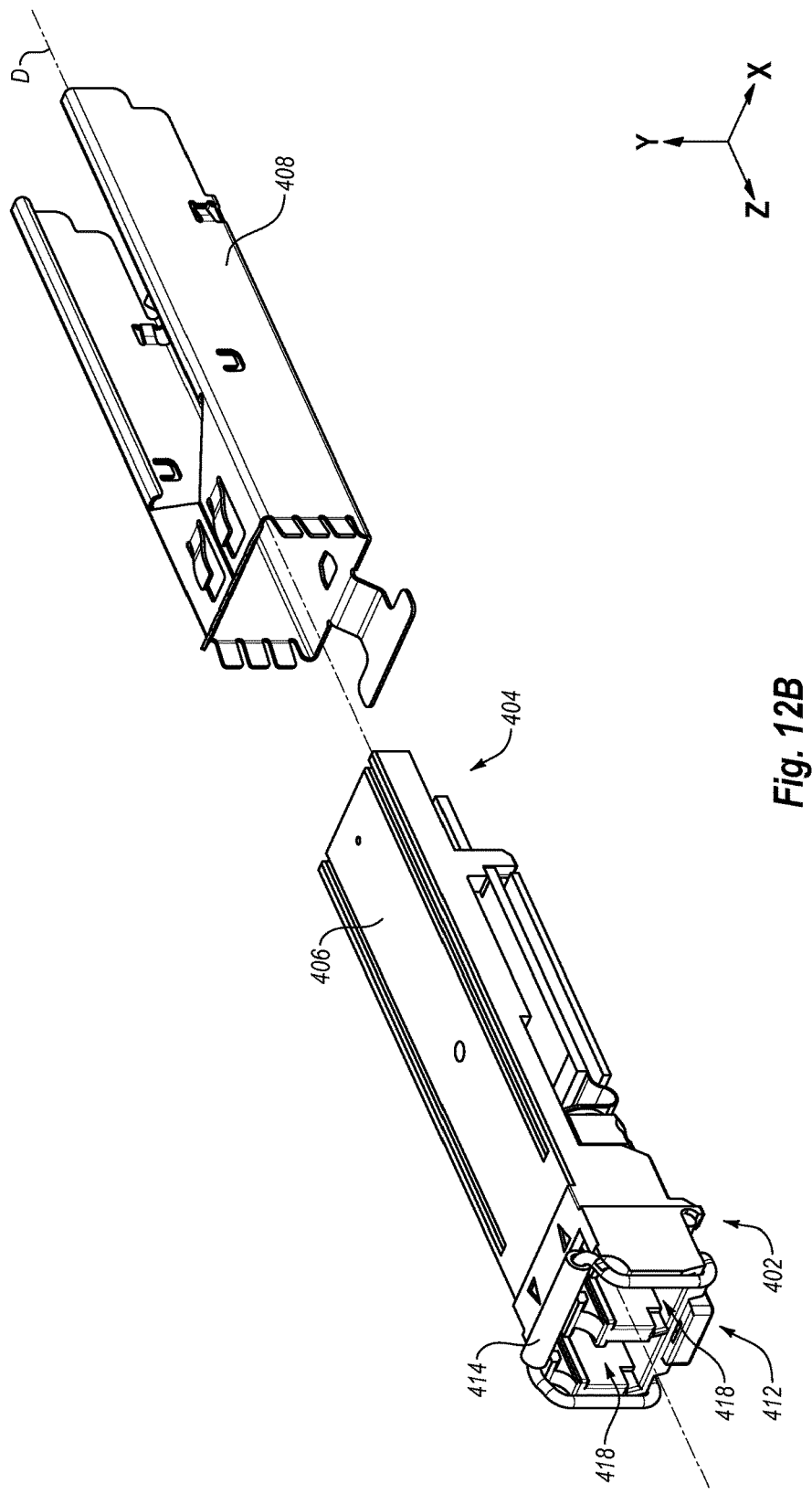

FIG. 12B is a perspective view of the optoelectronic module 400 and the enclosure 408 with the optoelectronic module 400 outside of the enclosure 408. As illustrated, the optoelectronic module 400 may be sized and shaped to interface with the enclosure 408. The optoelectronic module 400 may be positioned at least partially inside of the enclosure 408 along the Z-direction. The optoelectronic module 400 may be communicatively coupled to the host device and the latching mechanism 412 may fasten and/or release the optoelectronic module 400 with respect to a host receptacle.

As illustrated, the optoelectronic module 400 may include a housing 406 that extends along a longitudinal axis D of the optoelectronic module 400 between a first end portion 402 and a second end portion 404 of the optoelectronic module 400. The longitudinal axis D may extend in substantially the Z-direction. The first end portion 402 of the optoelectronic module 400 is configured to interface with two fiber optic cables, each including one or more optical fibers. Specifically, the optoelectronic module 400 may include ports 418 positioned at the first end portion 402 and configured to receive a fiber optic cable.

In some configurations, the ports 418 may be configured to receive a ferrule attached to ends of one or more optical fibers. Once mounted to the host receptacle and coupled with fiber optic cables, the optoelectronic module 400 may be configured to communicate data between the host device and a network, for example.

Figure 13A:
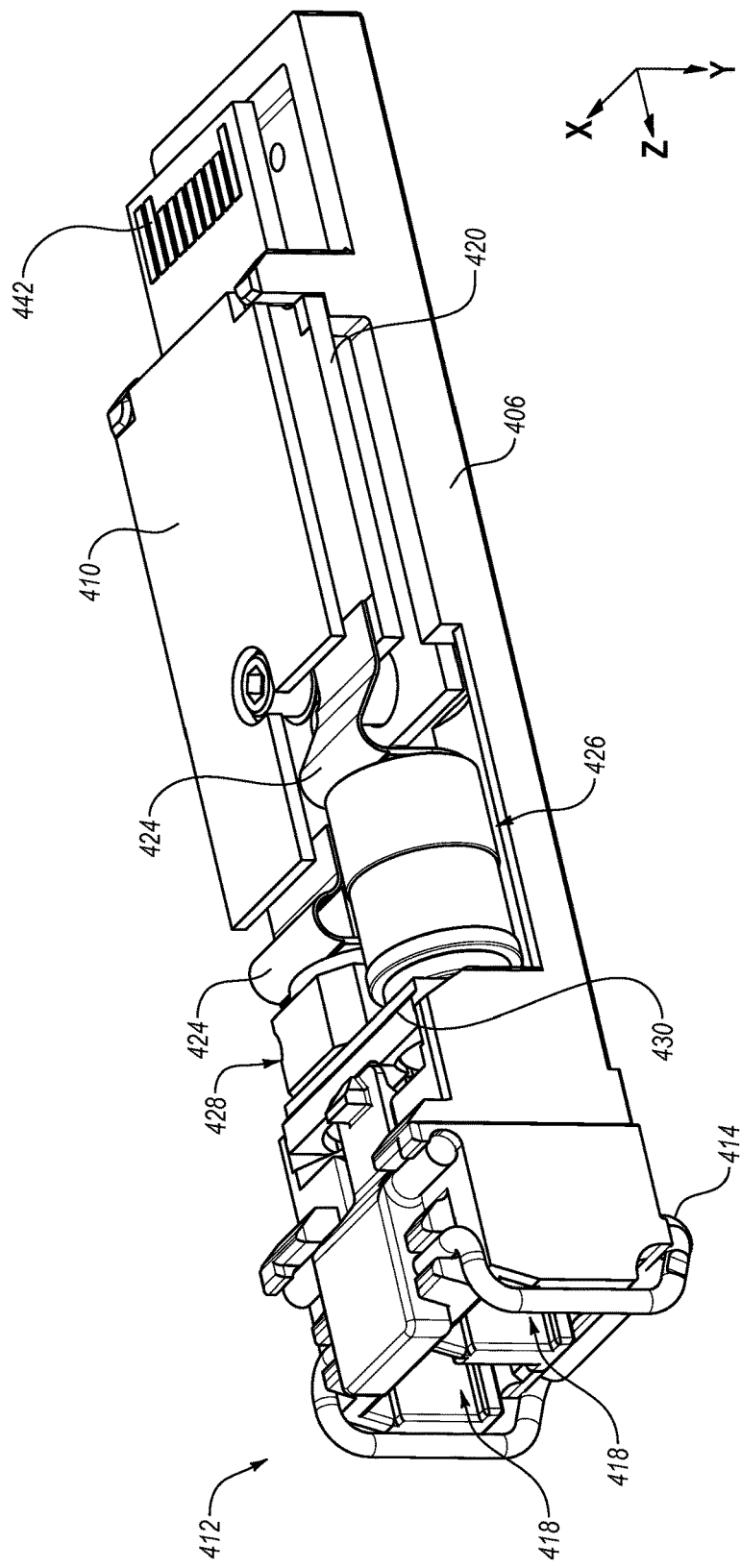
FIG. 13A is a bottom perspective view of the optoelectronic module of FIGS. 12A-12B.
Figure 13B:
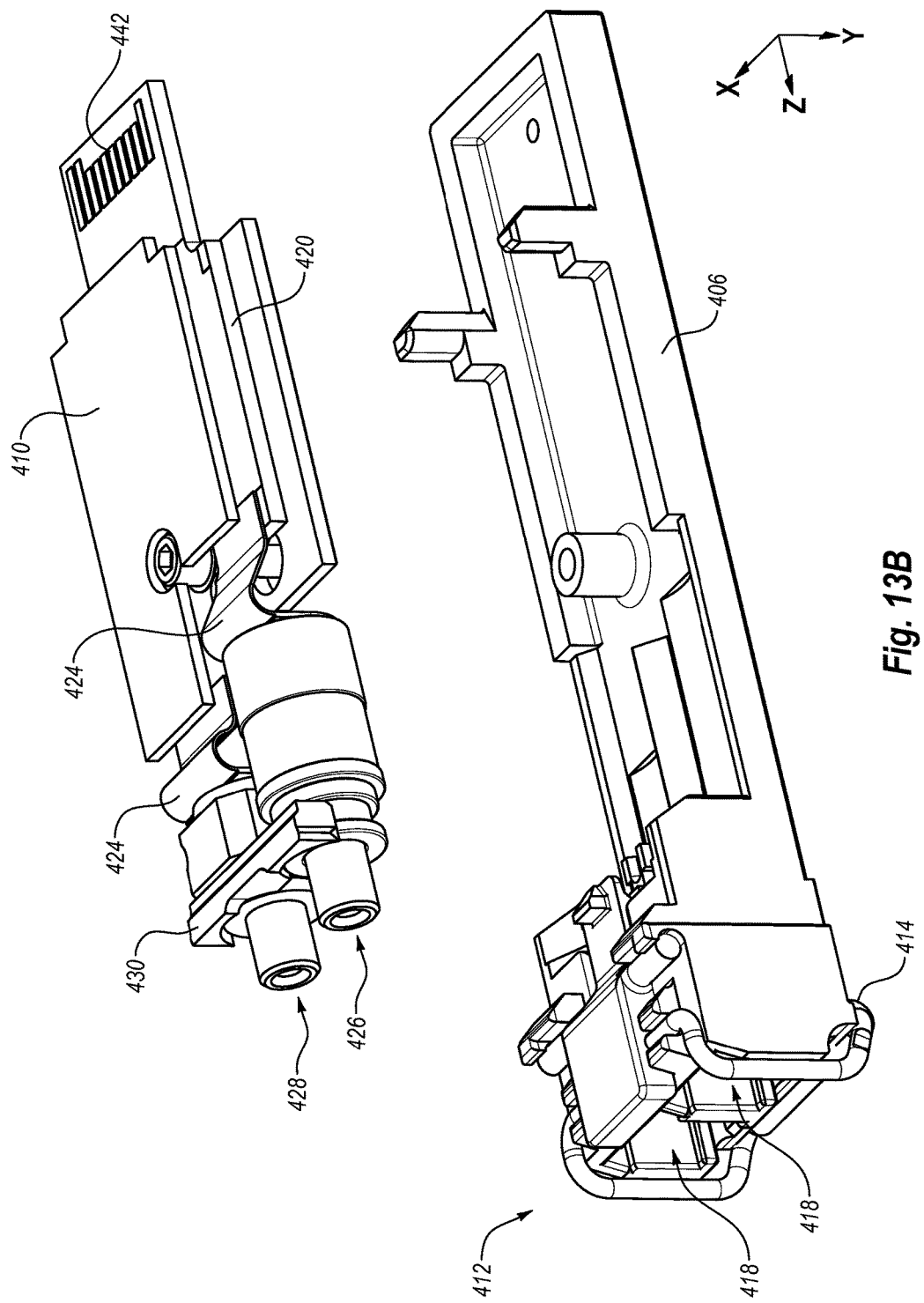
FIG. 13B is an exploded view of the optoelectronic module of FIGS. 12A-12B.

FIG. 13A is a bottom perspective view of the optoelectronic module 400 with the enclosure 408 not shown. FIG. 13B is an exploded view of the optoelectronic module 400. As illustrated in FIGS. 13A-13B, the optoelectronic module 400 may include a TOSA 426 and ROSA 428 positioned inside of the housing 406. The TOSA 426 may include one or more transmitters and the ROSA 428 may include one or more receivers. The optoelectronic module 400 may include a PCB 420 generally surrounded by the housing 406 and the enclosure 408. The TOSA 426 and/or the ROSA 428 may be electrically coupled to the PCB 420 by electrical connectors 424, such as electrical flex. In the illustrated configuration, an electrical connector such as an edge connector 442 is included in the PCB 420, although other implementations are possible.

The optoelectronic module 400 may convert electrical signals to optical signals representing the electrical signals and vice versa. For example, data in the form of optical signals may be communicated from a network along a fiber optic cable to the optoelectronic module 400. The ROSA 428 of the optoelectronic module 400 may convert the optical signals to electrical signals representative of the optical signals. The electrical signals may then be communicated to a host device. Likewise, the host device may communicate electrical signals to the optoelectronic module 400. The TOSA 426 of the optoelectronic module 400 may convert the electrical signals to optical signals representative of the electrical signals. The optical signals may be communicated along the fiber optic cable into the network to, e.g., another optoelectronic module 400.

The optoelectronic module 400 may be removably attached to fiber optic cables, in which case the optoelectronic module 400 may include a stand-alone module. Although the example optoelectronic module 400 is configured to be substantially compliant with the SFP MSA, the optoelectronic module 400 can instead be configured to assume a variety of different form factors that are substantially compliant with various transceiver and/or transponder MSAs including, but not limited to, SFF, XFP, QSFP, XPAK, X2, XENPAK, or CXP.

With continued reference to FIGS. 13A-13B, the optoelectronic module 400 may include a port retention bar 430. The port retention bar 430 may be positioned inside of the housing 406 and be operably coupled to the TOSA 426 and the ROSA 428. The port retention bar 430 may be configured to support and retain the TOSA 426 and the ROSA 428 with respect to the housing 406. Additionally or alternatively, the port retention bar 430 may be configured to retain the TOSA 426 and the ROSA 428 with respect to one another. The port retention bar 430 may be disposed against the housing 406, the TOSA 426, and the ROSA 428, to retain the components with respect to one another.

The port retention bar 430 may be an EMI attenuating components formed of a plastic material that is configured to attenuate EMI. The port retention bar 430 may be at least partially formed of a plastic material filled with nickel coated carbon fiber and/or electrically conductive filler in some embodiments. The port retention bar 430 may be formed by injection molding. The port retention bar 430 may be an EMI attenuating component configured to attenuate EMI generated by one or more other components of the optoelectronic module 400. For example, the port retention bar 430 may attenuate or shield EMI generated by the TOSA 426, the ROSA 428, electrical connectors 424, the PCB 420 and/or components mounted to the PCB 420 of the optoelectronic module 400.

Figure 14A:
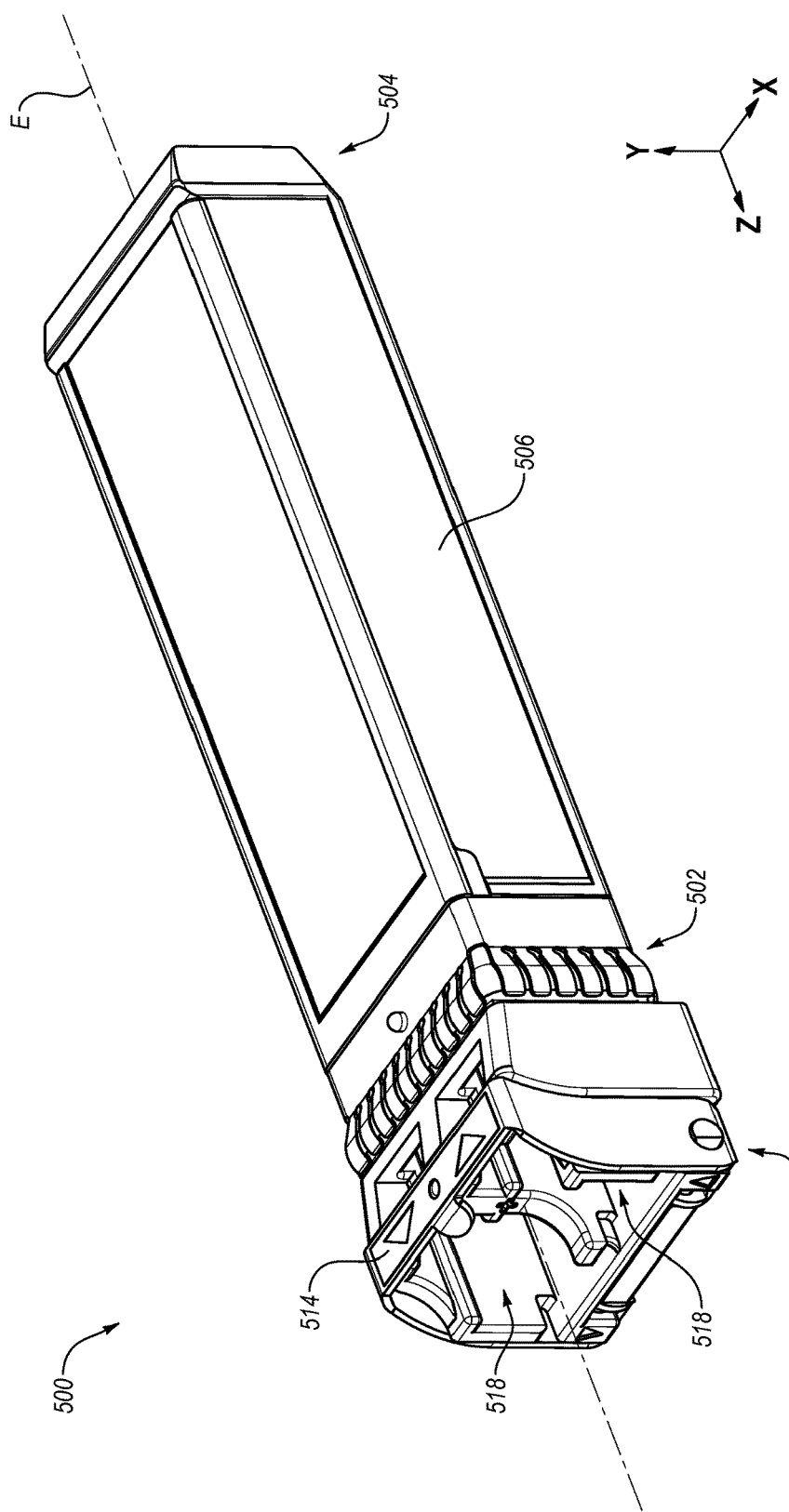
FIG. 14A is a perspective view of another example optoelectronic module.
Figure 14B:
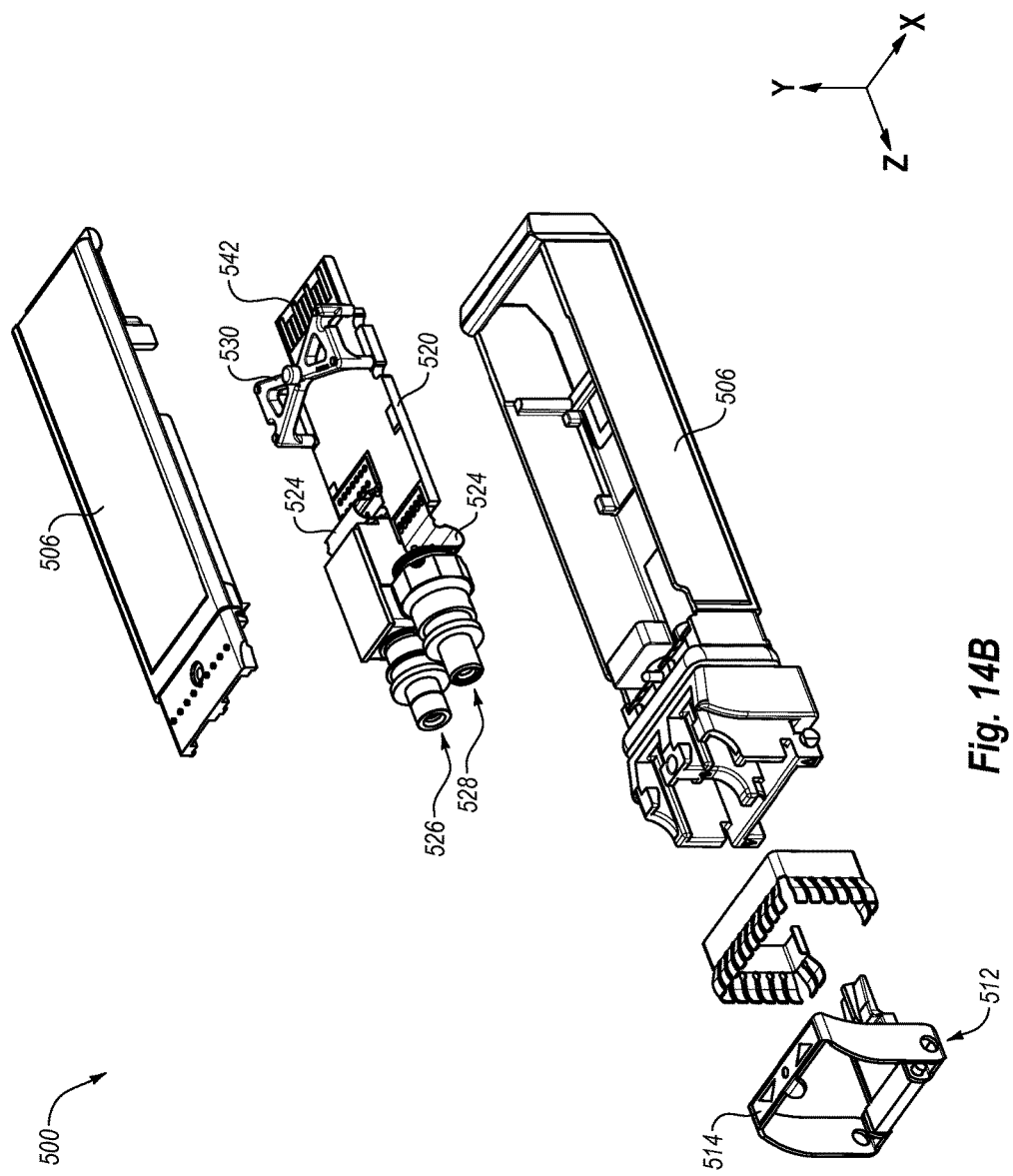
FIG. 14B is an exploded view of the optoelectronic module of FIG. 14A.
Figure 15:
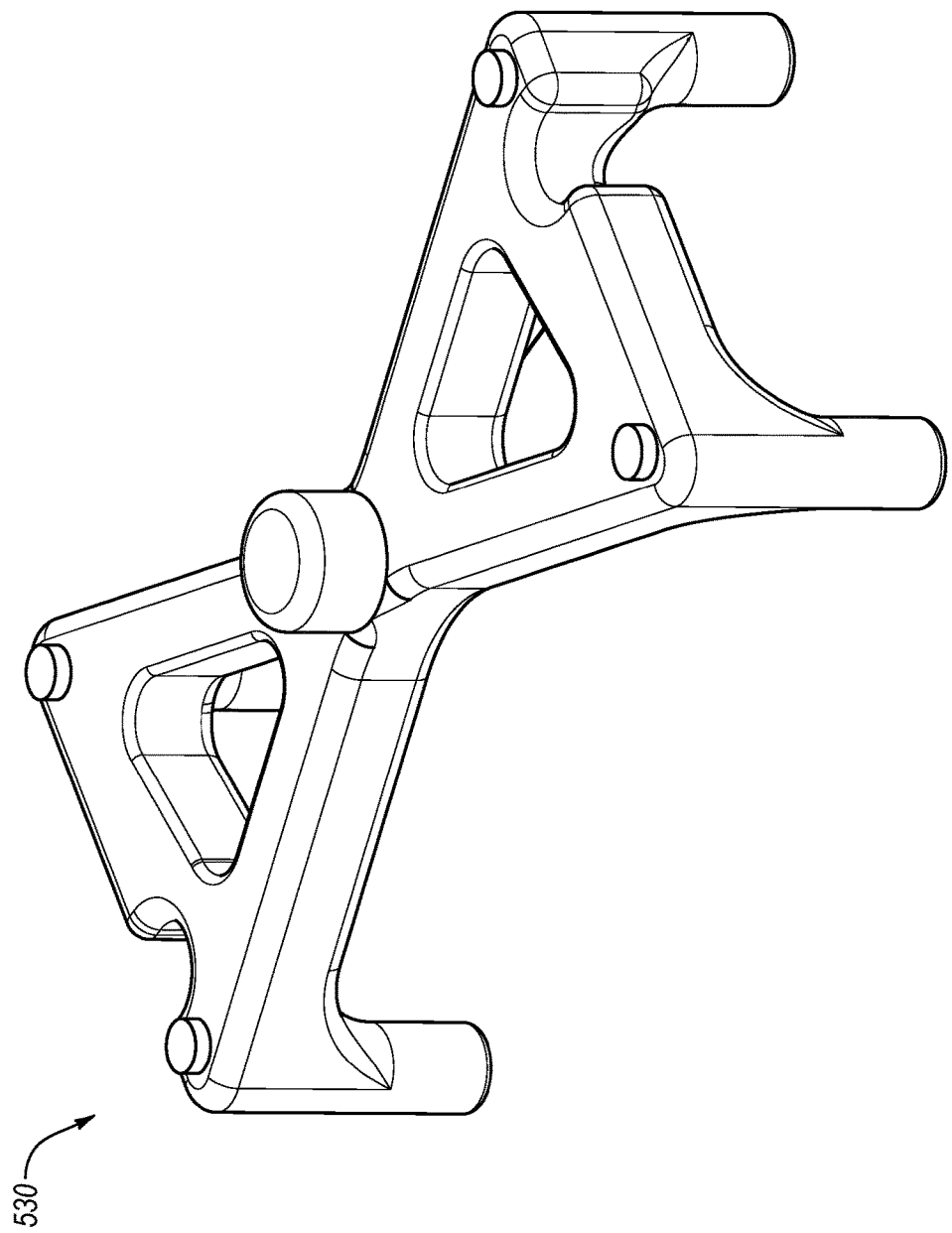
FIG. 15 is a perspective view of an example PCB compression plate of the optoelectronic module of FIG. 14A.

FIGS. 14A-14B and 15 illustrate views of an example embodiment of another optoelectronic module 500. FIG. 14A is a perspective view of the optoelectronic module 500. The optoelectronic module 500 may be designed to be plugged into a larger electronic system such as a PCB of a host device or the like. For example, the optoelectronic module 500 includes a latching mechanism 512 with a handle 514 that may be operated to fasten and/or release the optoelectronic module 500 with respect to other components. Once mounted to a host PCB, the optoelectronic module 500 may be configured to communicate data between the host device and a network, for example.

As illustrated, the optoelectronic module 500 may include a housing 506 that extends along a longitudinal axis E of the optoelectronic module 500 between a first end portion 502 and a second end portion 504 of the optoelectronic module 500. The longitudinal axis E may extend in substantially the Z-direction. The first end portion 502 of the optoelectronic module 500 is configured to interface with two fiber optic cables, each including one or more optical fibers. Specifically, the optoelectronic module 500 may include ports 518 positioned at the first end portion 502 and configured to receive a fiber optic cable. In some configurations, the ports 518 may be configured to receive a ferrule attached to ends of one or more optical fibers. Once mounted to a host receptacle and coupled with fiber optic cables, the optoelectronic module 500 may be configured to communicate data between the host device and a network, for example.

FIG. 14B is an exploded view of the optoelectronic module 500. As illustrated, the optoelectronic module 500 may include a TOSA 526 and ROSA 528 positioned inside of the housing 506. The TOSA 526 may include one or more transmitters and the ROSA 528 may include one or more receivers. The optoelectronic module 500 may include a PCB 520 generally surrounded by the housing 506. The TOSA 526 and/or the ROSA 528 may be electrically coupled to the PCB 520 by electrical connectors 524, such as electrical flex. In the illustrated configuration, an electrical connector such as an edge connector 542 is included in the PCB 520, although other implementations are possible.

The optoelectronic module 500 may convert electrical signals to optical signals representing the electrical signals and vice versa. For example, data in the form of optical signals may be communicated from a network along a fiber optic cable to the optoelectronic module 500. The ROSA 528 of the optoelectronic module 500 may convert the optical signals to electrical signals representative of the optical signals. The electrical signals may then be communicated to a host device. Likewise, the host device may communicate electrical signals to the optoelectronic module 500. The TOSA 526 of the optoelectronic module 500 may convert the electrical signals to optical signals representative of the electrical signals. The optical signals may be communicated along the fiber optic cable into the network to, e.g., another optoelectronic module 500.

The optoelectronic module 500 may be removably attached to fiber optic cables, in which case the optoelectronic module 500 may include a stand-alone module. Although the example optoelectronic module 500 is configured to be substantially compliant with the SFP+ MSA, the optoelectronic module 500 can instead be configured to assume a variety of different form factors that are substantially compliant with various transceiver and/or transponder MSAs including, but not limited to, SFF, XFP, QSFP, XPAK, X2, XENPAK, or CXP.

With continued reference to FIG. 14B, the optoelectronic module 500 may include a PCB compression plate 530. The PCB compression plate 530 may be positioned inside of the housing 506 and may be operably coupled to the PCB 520. The PCB compression plate 530 may be configured to retain the PCB 520 with respect to the housing 506 in at least one direction transverse to the longitudinal axis E. Additionally or alternatively, the PCB compression plate 530 may be configured to retain the PCB 520 with respect to other components of the optoelectronic module 500. The PCB compression plate 530 may be disposed against the housing 506 and the PCB 520 to retain the components with respect to one another.

FIG. 15 is a perspective view of the PCB compression plate 530. The PCB compression plate 530 may be an EMI attenuating component formed of a plastic material that is configured to attenuate EMI. The PCB compression plate 530 may be at least partially formed of a plastic material filled with nickel coated carbon fiber and/or electrically conductive filler in some embodiments. The PCB compression plate 530 may be formed by injection molding. The PCB compression plate 530 may be an EMI attenuating component configured to attenuate EMI generated by one or more other components of the optoelectronic module 500. For example, the PCB compression plate 530 may attenuate or shield EMI generated by the TOSA 526, the ROSA 528, the PCB 520 and/or components mounted to the PCB 520 of the optoelectronic module 500.

Figure 16A:
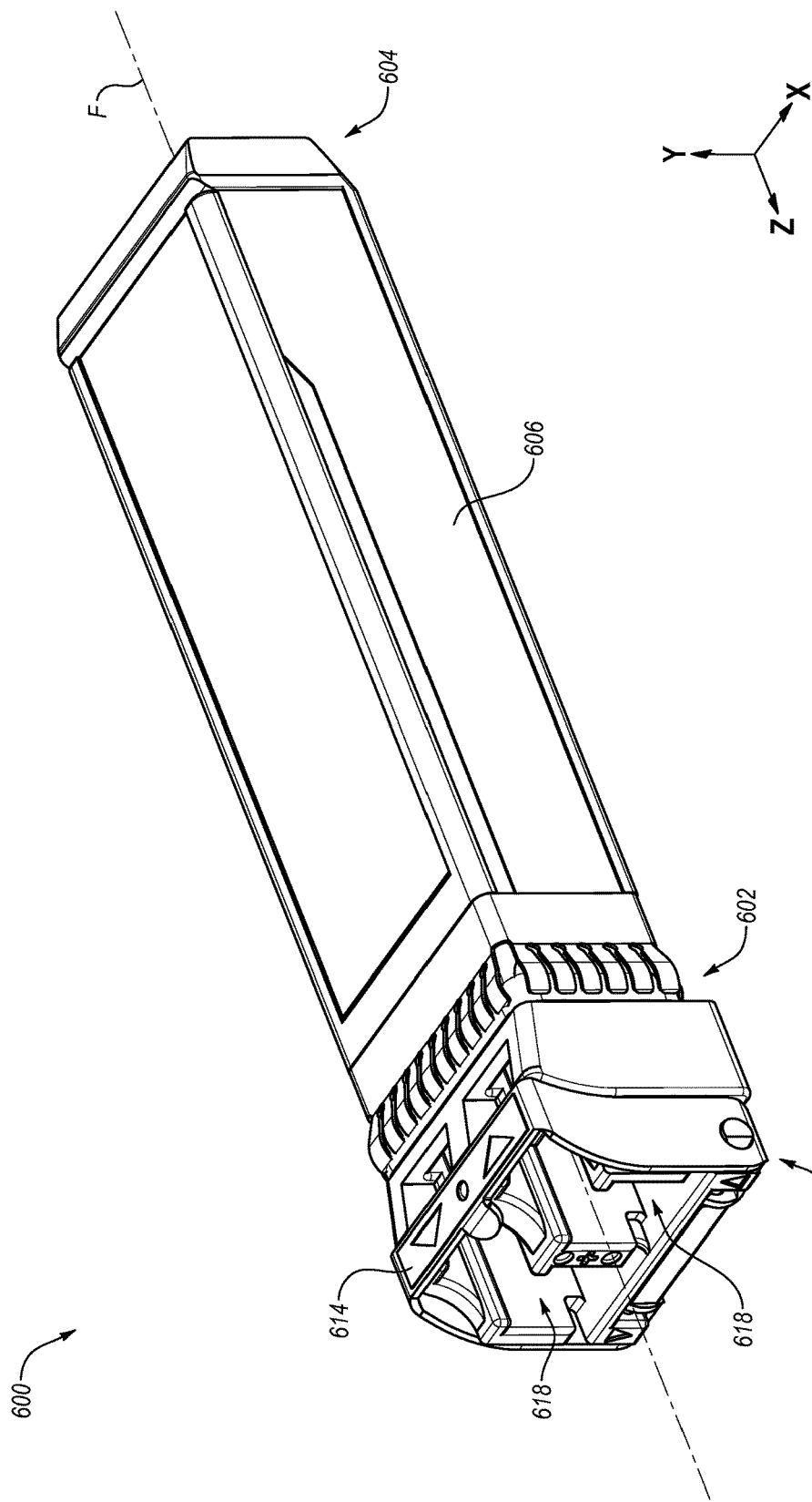
FIG. 16A is a perspective view of another example optoelectronic module.
Figure 16B:
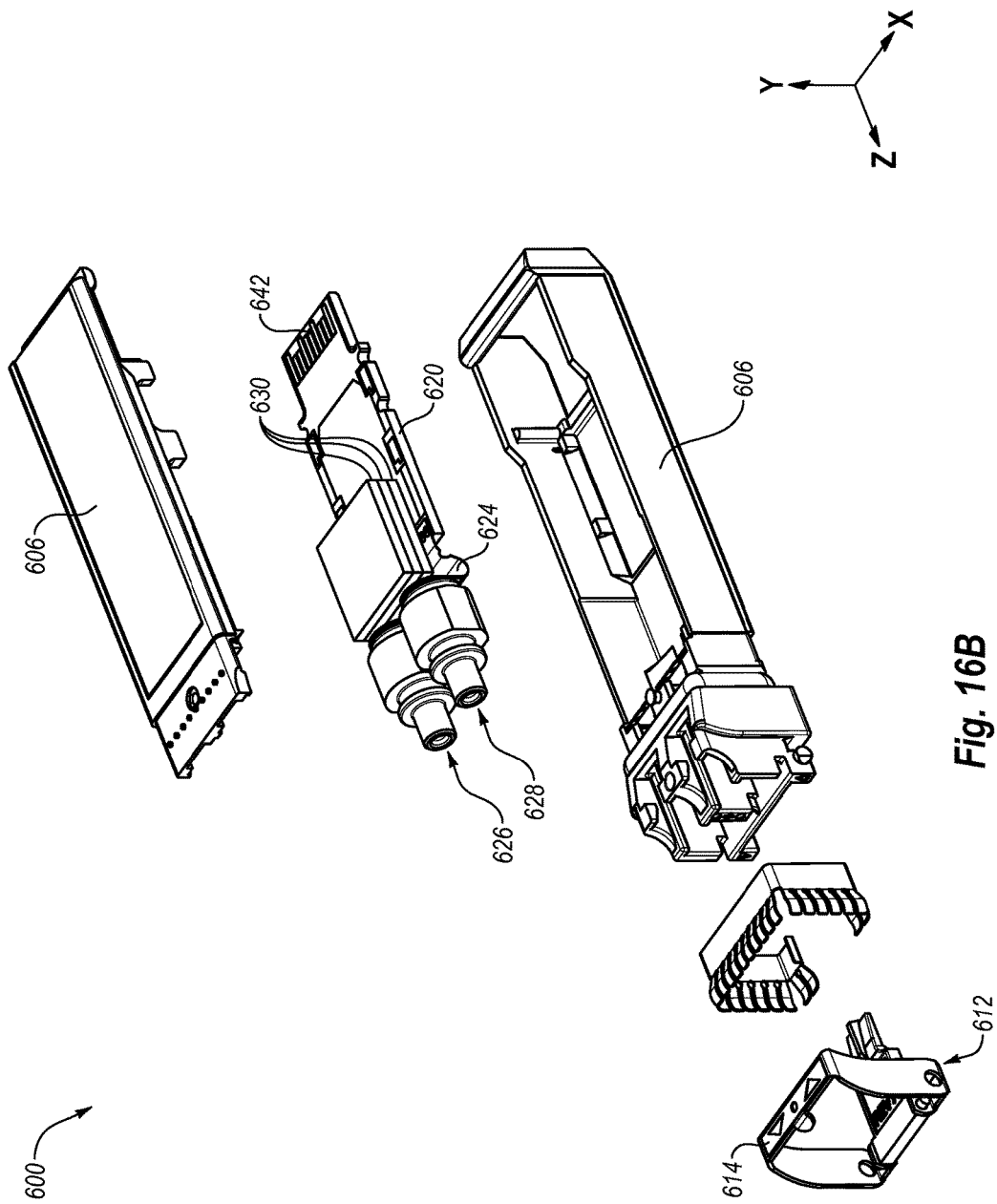
FIG. 16B is an exploded view of the optoelectronic module of FIG. 16A.
Figure 17:
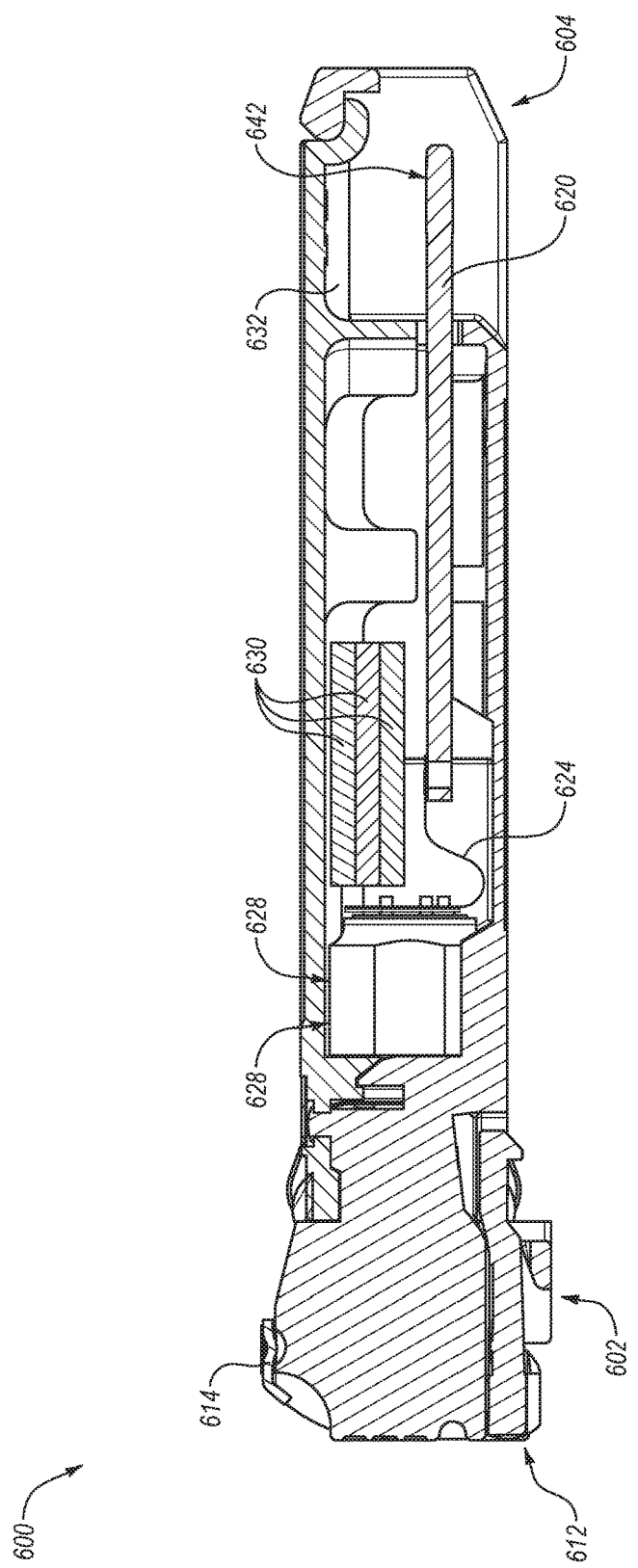
FIG. 17 is a section view of the optoelectronic module of FIG. 16A.

FIGS. 16A-16B and 17 illustrate views of an example embodiment of an optoelectronic module 600. FIG. 16A is a perspective view of the optoelectronic module 600. The optoelectronic module 600 may be designed to be plugged into a larger electronic system such as a PCB of a host device or the like. For example, the optoelectronic module 600 includes a latching mechanism 612 with a handle 614 that may be operated to fasten and/or release the optoelectronic module 600 with respect to other components. Once mounted to a host PCB, the optoelectronic module 600 may be configured to communicate data between the host device and a network, for example.

As illustrated, the optoelectronic module 600 may include a housing 606 that extends along a longitudinal axis F of the optoelectronic module 600 between a first end portion 602 and a second end portion 604 of the optoelectronic module 600. The longitudinal axis F may extend in substantially the Z-direction. The first end portion 602 of the optoelectronic module 600 is configured to interface with two fiber optic cables, each including one or more optical fibers. Specifically, the optoelectronic module 600 may include ports 618 positioned at the first end portion 602 and configured to receive a fiber optic cable. In some configurations, the ports 618 may be configured to receive a ferrule attached to ends of one or more optical fibers. Once mounted to a host receptacle and coupled with fiber optic cables, the optoelectronic module 600 may be configured to communicate data between the host device and a network, for example.

FIG. 16B is an exploded view of the optoelectronic module 600. The optoelectronic module 600 may include a TOSA 626 and ROSA 628 positioned inside of the housing 606. The TOSA 626 may include one or more transmitters and the ROSA 628 may include one or more receivers. The optoelectronic module 600 may include a PCB 620 generally surrounded by the housing 606. The TOSA 626 and/or the ROSA 628 may be electrically coupled to the PCB 620 by electrical connectors 624 such as electrical flex. In the illustrated configuration, an electrical connector such as an edge connector 642 is included in the PCB 620, although other implementations are possible.

The optoelectronic module 600 may convert electrical signals to optical signals representing the electrical signals and vice versa. For example, data in the form of optical signals may be communicated from a network along a fiber optic cable to the optoelectronic module 600. The ROSA 628 of the optoelectronic module 600 may convert the optical signals to electrical signals representative of the optical signals. The electrical signals may then be communicated to a host device. Likewise, the host device may communicate electrical signals to the optoelectronic module 600. The TOSA 626 of the optoelectronic module 600 may convert the electrical signals to optical signals representative of the electrical signals. The optical signals may be communicated along the fiber optic cable into the network to, e.g., another optoelectronic module 600.

The optoelectronic module 600 may be removably attached to fiber optic cables, in which case the optoelectronic module 600 may include a stand-alone module. Although the example optoelectronic module 600 is configured to be substantially compliant with the SFP+ MSA, the optoelectronic module 600 can instead be configured to assume a variety of different form factors that are substantially compliant with various transceiver and/or transponder MSAs including, but not limited to, SFF, XFP, QSFP, XPAK, X2, XENPAK, or CXP.

With continued reference to FIG. 16B, the optoelectronic module 600 may include a flex EMI absorber 630. The flex EMI absorber 630 may be positioned inside of the housing 606 in a flex region of the optoelectronic module 600. The flex EMI absorber 630 may be coupled with the housing 606 and positioned proximate the TOSA 626 and the ROSA 628. In some configurations, the flex EMI absorber 630 may be a flex circuit soldered to the PCB 620.

In some aspects, the flex region may be defined as the region proximate the TOSA 626 and the ROSA 628. Additionally or alternatively, the flex region may be defined as the region substantially above the PCB 620. Additionally or alternatively, the flex region may be defined as the region proximate one or both of the ports 618. In some aspects, the flex region may refer to the region inside of the housing 606.

The flex EMI absorber 630 may be an EMI attenuating component formed of a plastic material that is configured to attenuate EMI. The flex EMI absorber 630 may be at least partially formed of a plastic material filled with nickel coated carbon fiber and/or electrically conductive filler in some embodiments. The flex EMI absorber 630 may be formed by injection molding. The flex EMI absorber 630 may be an EMI attenuating component configured to attenuate EMI generated by one or more other components in the flex region of the optoelectronic module 600. For example, the flex EMI absorber 630 may attenuate or shield EMI generated in the flex region of the optoelectronic module 600.

FIG. 17 is a section view of the optoelectronic module 600. As illustrated, in some configurations, the flex EMI absorber 630 may be positioned above a portion of the PCB 620 and the electrical connector 624, and proximate the TOSA 626 and the ROSA 628. In some configurations, the flex EMI absorber 630 may be positioned above the TOSA 626 and the ROSA 628. In further configurations, the flex EMI absorber 630 may be positioned above the ports 618. In some configurations, the flex EMI absorber 630 may be positioned to attenuate EMI between the housing 606 and a host cage.

In the illustrated configuration, the flex EMI absorber 630 includes three (3) rectangular portions of EMI plastic material. In other configurations, the flex EMI absorber 630 may include other shapes, dimensions, and/or number of portions. In some implementations, the configuration (e.g., size, shape, number of portions, etc.) of the flex EMI absorber 630 may be adapted to correspond with the configuration of the optoelectronic module 600 and/or components that create EMI. For example, the size, shape, and/or number of portions of the flex EMI absorber 630 may be adapted to correspond with the configuration of components of the optoelectronic module 600. In another example, the size, shape, and/or number of portions of the flex EMI absorber 630 may be adapted to attenuate EMI created by specific components of the optoelectronic module 600.

In some configurations, the optoelectronic module 600 may include a socket EMI absorber 632 positioned proximate the edge connector 642 in a socket region. The a socket EMI absorber 632 may be positioned above the edge connector 642 and/or may be configured to attenuate and/or absorb EMI generated by a host PCB socket that the edge connector 642 interfaces with. The socket EMI absorber 632 may be positioned inside of the housing 606 in a socket region of the optoelectronic module 600. The socket EMI absorber 632 may be coupled with the housing 606 and positioned proximate the edge connector 642.

In some aspects, the socket region may be defined as the region proximate the edge connector 642. Additionally or alternatively, the socket region may be defined as the region substantially above the PCB 620 near the edge connector 642 and/or above the edge connector 642. In some aspects, the socket region may refer to the region inside of the housing 606.

The socket EMI absorber 632 may be an EMI attenuating component formed of a plastic material that is configured to attenuate EMI. The socket EMI absorber 632 may be at least partially formed of a plastic material filled with nickel coated carbon fiber and/or electrically conductive filler in some embodiments. The socket EMI absorber 632 may be formed by injection molding. The socket EMI absorber 632 may be an EMI attenuating component configured to attenuate EMI generated by one or more other components in the socket region of the optoelectronic module 600. For example, the socket EMI absorber 632 may attenuate or shield EMI generated in the socket region of the optoelectronic module 600.

Figure 18A:
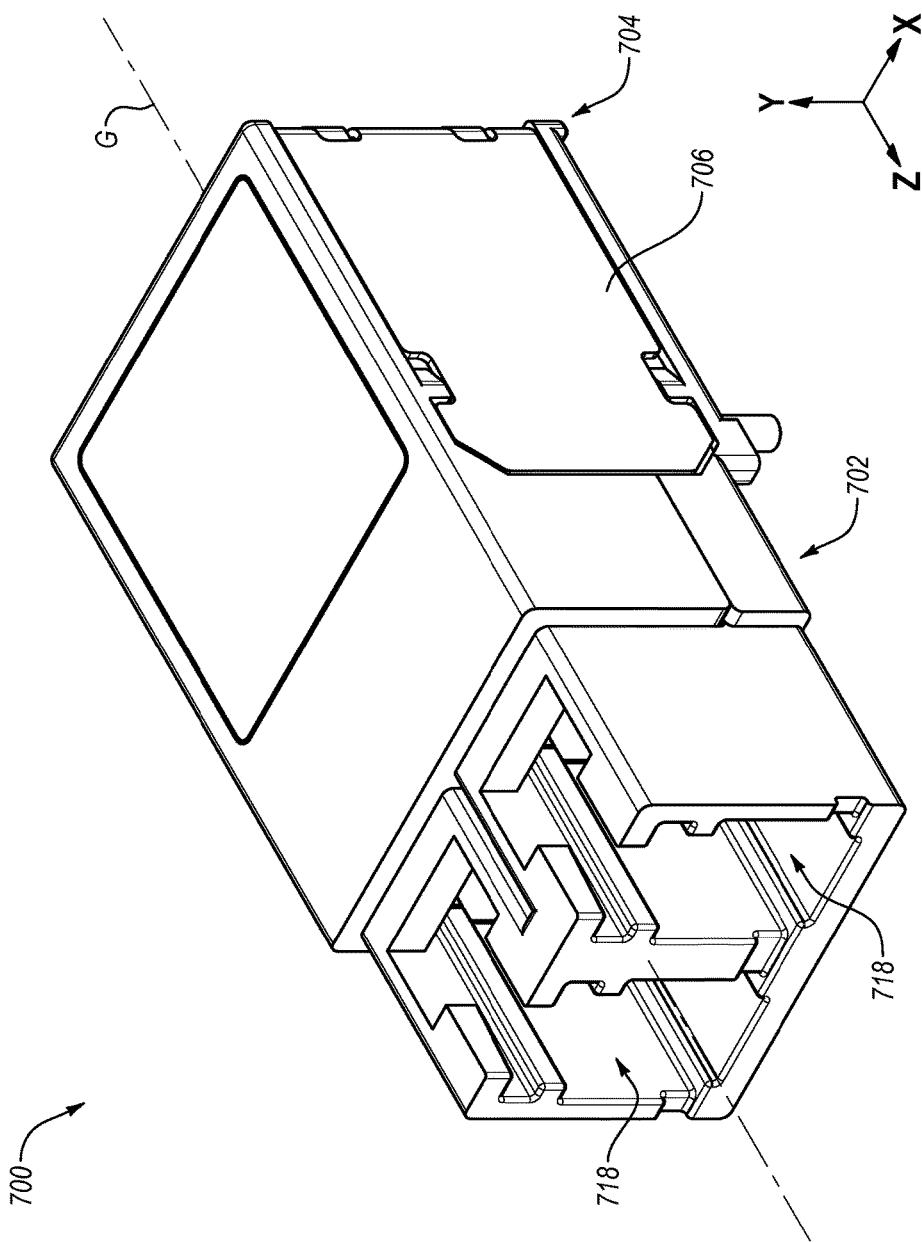
FIG. 18A is a perspective view of another example optoelectronic module.

FIGS. 18A-18B, 19 and 20 illustrate views of an example embodiment of another optoelectronic module 700. FIG. 18A is a perspective view of the optoelectronic module 700. As illustrated, the optoelectronic module 700 may include a housing 706 that extends along a longitudinal axis G of the optoelectronic module 700 between a first end portion 702 and a second end portion 704 of the optoelectronic module 700. The longitudinal axis G may extend in substantially the Z-direction. The optoelectronic module 700 may be configured to communicate data between the host device and a network, for example. The first end portion 702 of the optoelectronic module 700 is configured to interface with two fiber optic cables, each including one or more optical fibers. Specifically, the optoelectronic module 700 may include ports 718 positioned at the first end portion 702 and configured to receive a fiber optic cable. In some configurations, the ports 718 may be configured to receive a ferrule attached to ends of one or more optical fibers. Once mounted to a host receptacle and coupled with fiber optic cables, the optoelectronic module 700 may be configured to communicate data between the host device and a network, for example.

Figure 18B:
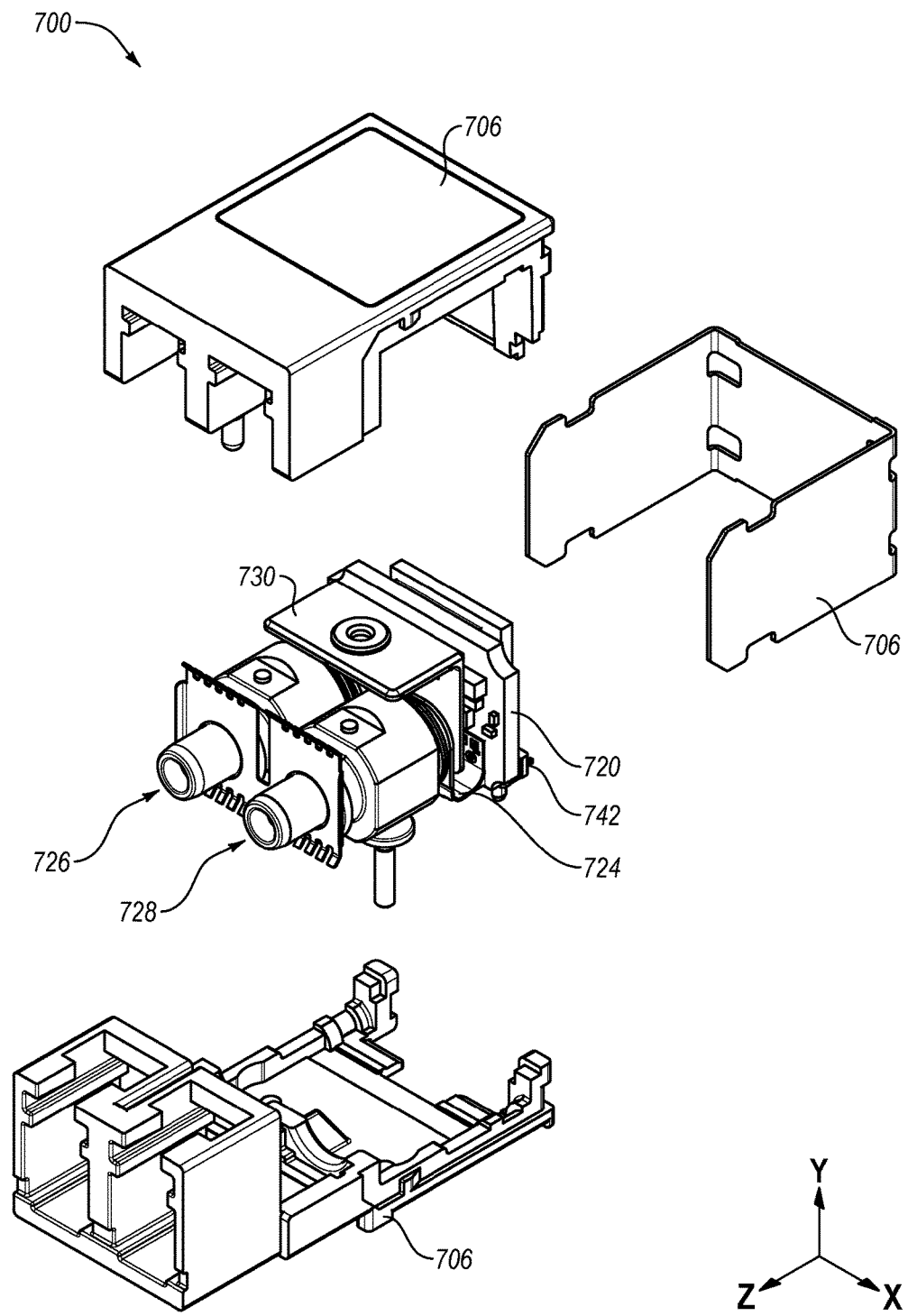
FIG. 18B is an exploded view of the optoelectronic module of FIG. 18A.
Figure 19:
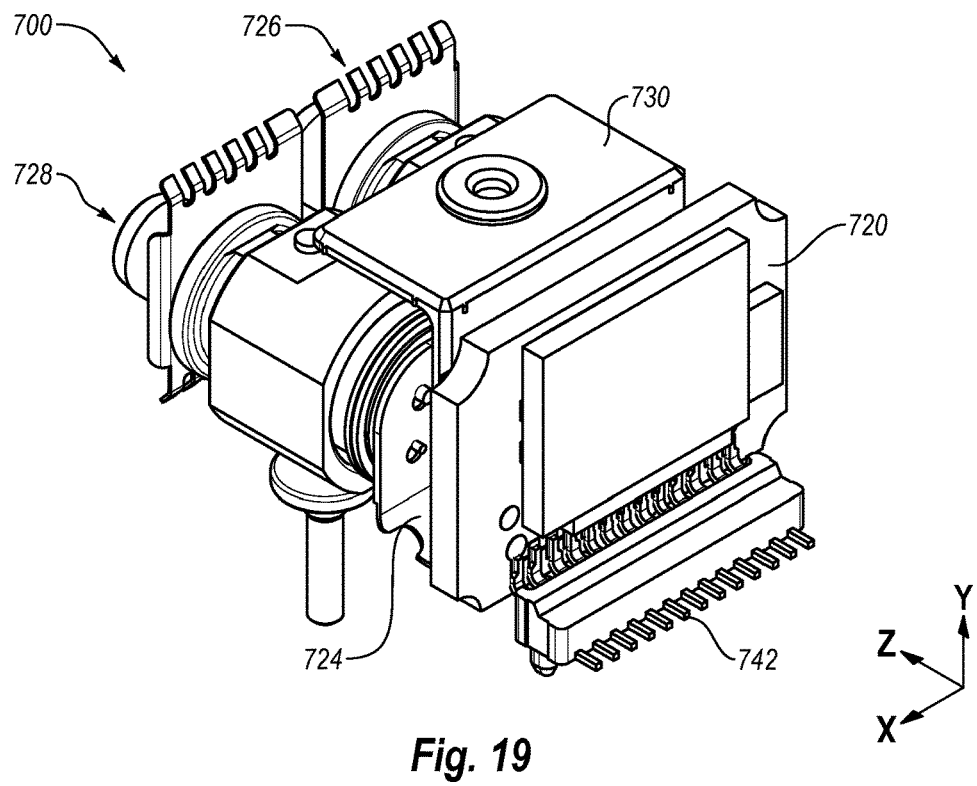
FIG. 19 is a view of a portion of the optoelectronic module of FIG. 18A.

FIG. 18B is an exploded view of the optoelectronic module 700. FIG. 19 is a view of the optoelectronic module 700 with the housing 706 not shown. As illustrated, the optoelectronic module 700 may include a TOSA 726 and ROSA 728 positioned inside of the housing 706. The TOSA 726 may include one or more transmitters and the ROSA 728 may include one or more receivers. The optoelectronic module 700 may include a PCB 720 generally surrounded by the housing 706. The TOSA 726 and/or the ROSA 728 may be electrically coupled to the PCB 720 by electrical connectors 724, such as electrical flex. In the illustrated configuration, an electrical connector 742 is positioned on and electrically coupled to the PCB 720, although other implementations are possible.

The optoelectronic module 700 may convert electrical signals to optical signals representing the electrical signals and vice versa. For example, data in the form of optical signals may be communicated from a network along a fiber optic cable to the optoelectronic module 700. The ROSA 728 of the optoelectronic module 700 may convert the optical signals to electrical signals representative of the optical signals. The electrical signals may then be communicated to a host device. Likewise, the host device may communicate electrical signals to the optoelectronic module 700. The TOSA 726 of the optoelectronic module 700 may convert the electrical signals to optical signals representative of the electrical signals. The optical signals may be communicated along the fiber optic cable into the network to, e.g., another optoelectronic module 700.

The optoelectronic module 700 may be removably attached to fiber optic cables, in which case the optoelectronic module 700 may include a stand-alone module. The optoelectronic module 700 may be configured to include a compact form factor. For example, the optoelectronic module 700 may be substantially half of the size of standard SFF transceivers. In the illustrated configuration, the optoelectronic module 700 may support 125 Mb/s to 10.3 Gb/s optical data links over multimode fibers. In the illustrated configuration, the optoelectronic module 700 may comply with requirements for Gigabit Ethernet, 10 Gigabit Ethernet, and Fibre Channel.

With continued reference to FIGS. 18B and 19, the optoelectronic module 700 may include a three-dimensional EMI absorber 730. As illustrated, the three-dimensional EMI absorber 730 may be positioned inside of the housing 706 between the PCB 720, the TOSA 726 and the ROSA 728. The three-dimensional EMI absorber 730 may be coupled with the housing 706 and positioned proximate the TOSA 726 and the ROSA 728. In some aspects, the three-dimensional EMI absorber 730 may be formed by injection molding and/or may be coupled to the optoelectronic module 700 by swaging. For example, three-dimensional EMI absorber 730 may be coupled to the housing 706 and/or the TOSA 726 and the ROSA 728 by swaging. In other configurations, the three-dimensional EMI absorber 730 may be coupled to other components of the optoelectronic module 700. In further configurations, the three-dimensional EMI absorber 730 may not be formed by injection molding and/or may be coupled to the optoelectronic module 700 with other coupling methods.

As illustrated, in some configurations the three-dimensional EMI absorber 730 may be positioned above a portion of the TOSA 726 and the ROSA 728 and between the PCB 720 and the TOSA 726 and the ROSA 728. In further configurations, the three-dimensional EMI absorber 730 may be positioned above the ports 718. In some configurations, the three-dimensional EMI absorber 730 may be positioned to attenuate EMI between the housing 706 and a host cage.

Figure 20:
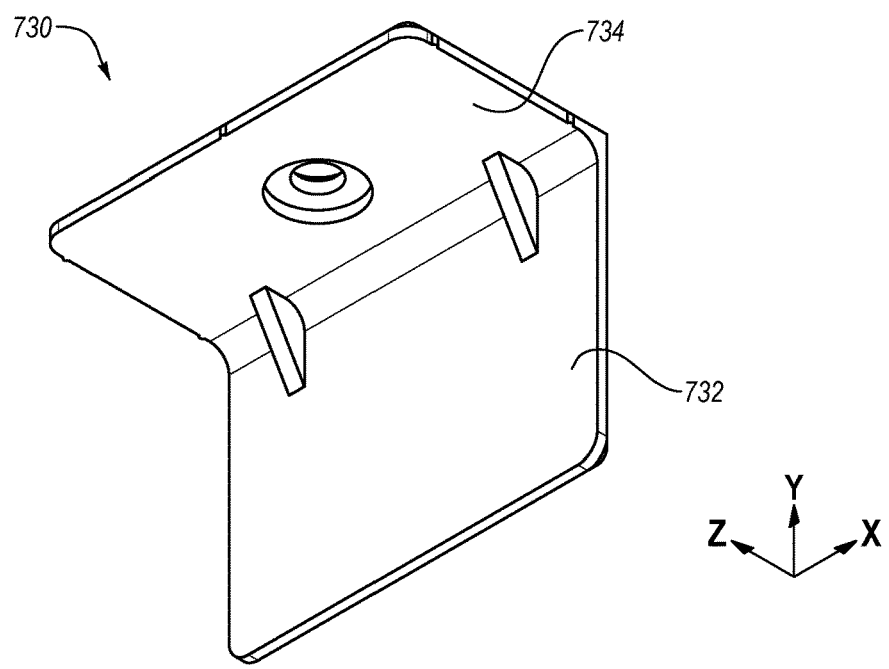
FIG. 20 is a perspective view of an example three-dimensional electromagnetic interference absorber of the optoelectronic module of FIG. 18A.

FIG. 20 is a perspective view of the three-dimensional EMI absorber 730. The three-dimensional EMI absorber 730 may be an EMI attenuating component formed of a plastic material that is configured to attenuate EMI. The three-dimensional EMI absorber 730 may be at least partially formed of a plastic material filled with nickel coated carbon fiber and/or electrically conductive filler in some embodiments. The three-dimensional EMI absorber 730 may be an EMI attenuating component configured to attenuate EMI generated by one or more other components in a region of the optoelectronic module 700. For example, the three-dimensional EMI absorber 730 may attenuate or shield EMI generated by the PCB 720 of the optoelectronic module 700. Such configurations may decrease or eliminate EMI from propagating toward portions of the optoelectronic module 700, for example, the ports 718.

In the illustrated configuration, the three-dimensional EMI absorber 730 includes a first portion 732 and a second portion 734 transverse to the first portion 732. As illustrated, the first portion 732 may be positioned at substantially 90 degrees with respect to the second portion 734. The first portion 732 may be sized and shaped to be positioned within the housing 706 between the PCB 720, the TOSA 726 and the ROSA 728. The second portion 734 may be sized and shaped to be positioned within the housing 706 between the housing 706, the TOSA 726 and the ROSA 728. In other configurations, the three-dimensional EMI absorber 730 may include other shapes, dimensions, and/or number of portions. In some implementations, the configuration (e.g., size, shape, number of portions, etc.) of the three-dimensional EMI absorber 730 may be adapted to correspond with the configuration of the optoelectronic module 700 and/or components that create EMI. For example, the size and/or shape of the three-dimensional EMI absorber 730 may be adapted to correspond with the configuration of components of the optoelectronic module 700. In another example, the size and/or shape of the three-dimensional EMI absorber 730 may be adapted to attenuate EMI created by specific components of the optoelectronic module 700.

Figure 21:
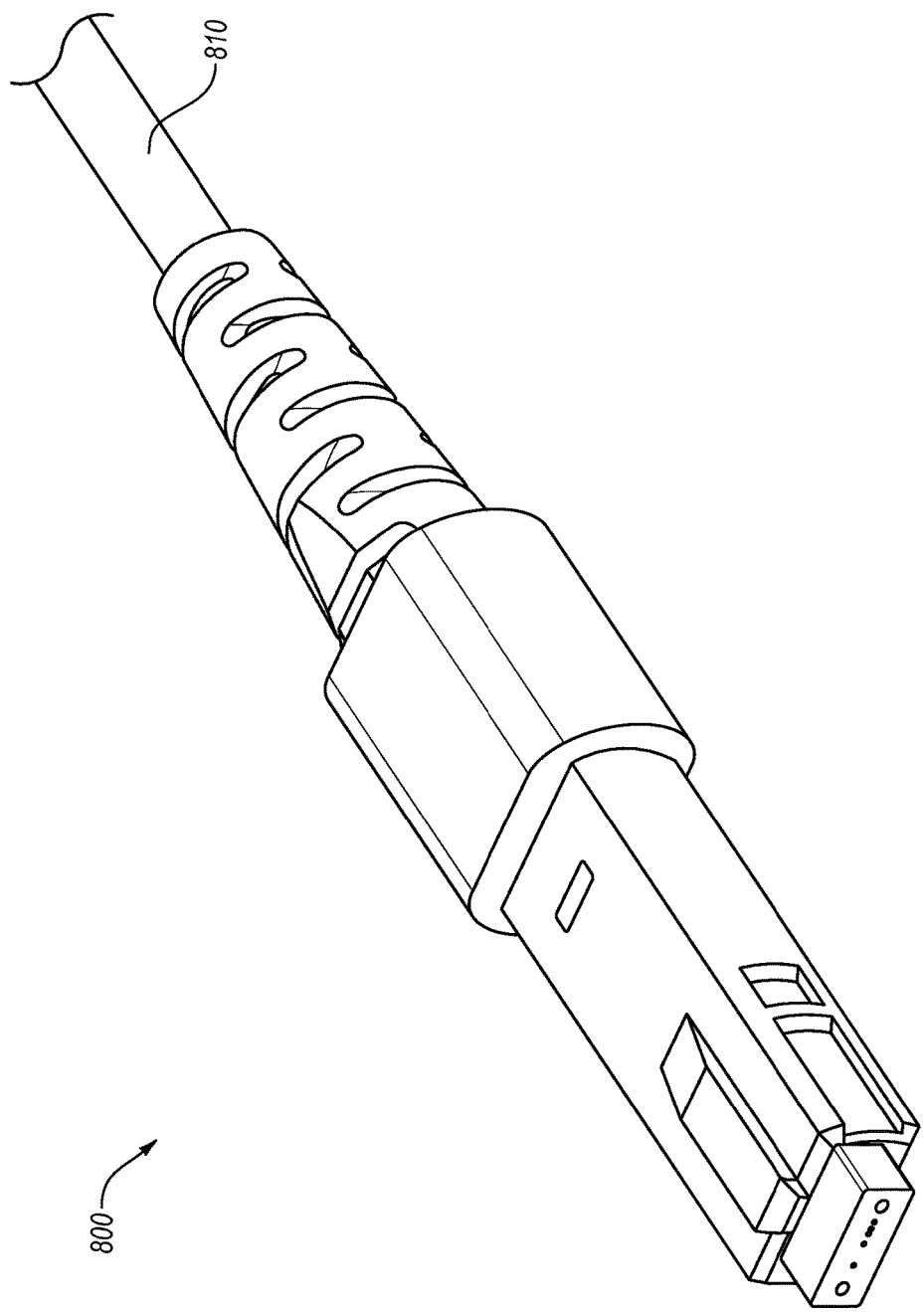
FIG. 21 is a perspective view of an example adapter.

FIG. 21 is a perspective view of an adapter 800 coupled to a fiber optic cable 810 that may include one or more optical fibers. The adapter 800 may be used between various fiber optic cables and optoelectronic modules, such as the optoelectronic modules 100, 200, 300, 400, 500, 600, 700. The adapter 800 may be operably connected between the fiber optic cable 810 and components within a housing of an optoelectronic module. Although the illustrated adapter 800 includes one example configuration, the adapter 800 may be configured to interface with any fiber optic cables and/or optoelectronic modules. In some aspects, the adapter 800 may be configured to interface with specific types of fiber optic cables and/or specific types of optoelectronic modules.

The adapter 800 may be an EMI attenuating component formed of a plastic material that is configured to attenuate EMI. The adapter 800 may be at least partially formed of a plastic material filled with nickel coated carbon fiber and/or electrically conductive filler in some embodiments. In some configurations, the adapter 800 may be formed by injection molding. The adapter 800 may be an EMI attenuating component configured to attenuate EMI generated by other components of an optoelectronic module, such as the optoelectronic modules 100, 200, 300, 400, 500, 600, and 700. For example, the adapter 800 may attenuate or shield EMI generated by electrical components and circuitry of the optoelectronic modules.

As discussed above, the EMI attenuating components may be formed of a plastic material that is configured to attenuate EMI. For example, the EMI attenuating components may be formed of a plastic material filled with nickel coated carbon fiber and/or electrically conductive filler in some embodiments. The EMI attenuating components attenuate EMI generated by components of optoelectronic modules, such as the optoelectronic modules 100, 200, 300, 400, 500, 600 and 700. In some aspects, the EMI attenuating components may be formed by forcing a molten plastic material that includes nickel-coated carbon fiber and/or electrically conductive filler into a mold cavity of a mold and solidifying the molten plastic material that includes the nickel-coated carbon fiber and/or electrically conductive filler into a shape that conforms to a contour of the mold according to an injection molding process.

As discussed above, the EMI attenuating components may be injection molded. In some aspects, forming the EMI attenuating components by injection molding may be less expensive than transfer molding similar or identical components. In some circumstances, it may be more difficult or impossible to form certain complex three-dimensional features by transfer molding. In contrast, in some circumstances injection molding may facilitate forming EMI attenuating components with more complex three-dimensional shapes. Injection molding may also facilitate formation of various components of optoelectronic modules when such components include complex shapes.

The terms and words used in this description and claims are not limited to the bibliographical meanings, but, are merely used to enable a clear and consistent understanding of the disclosure. It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic was intended to provide.

Aspects of the present disclosure may be embodied in other forms without departing from its spirit or essential characteristics. The described aspects are to be considered in all respects illustrative and not restrictive. The claimed subject matter is indicated by the appended claims rather than by the foregoing description. All changes which come within the meaning and range of equivalency of the claims are to be embraced within their scope.

What is claimed is:

1. An optoelectronic module comprising:
   a housing that extends along a longitudinal axis between a first end portion and a second end portion, the first end portion configured to interface with at least one fiber optic cable including one or more optical fibers;
   a printed circuit board ("PCB") within the housing that includes an electrical connector at the second end portion of the housing;

at least one transmitter positioned inside of the housing, the transmitter electrically coupled to the PCB and optically coupled with at least one of the one or more optical fibers;

at least one receiver positioned inside of the housing, the receiver electrically coupled to the PCB and optically coupled with at least another one of the one or more optical fibers;

at least one electromagnetic interference ("EMI") attenuating component formed of a plastic material that is configured to attenuate EMI, wherein the at least one EMI attenuating component is configured to attenuate EMI generated by one or more other components of the optoelectronic module and wherein the EMI attenuating component is selected from a group consisting of:
a PCB spacer, wherein the PCB spacer is positioned between the PCB and a second PCB in a double-deck PCB arrangement;
a three-dimensional EMI absorber including a first portion defining a first plane extending transverse to the longitudinal axis of the housing and positioned between the PCB and one or both of a transmitter optical subassembly ("TOSA") and a receiver optical subassembly ("ROSA"), and a second portion defining a second plane extending transverse to the first plane and parallel to the longitudinal axis of the housing, wherein the second portion is positioned between the housing and the TOSA or the ROSA.

2. The optoelectronic module of claim 1, wherein the plastic material comprises a plastic filled with one or more of: nickel coated carbon fiber, stainless steel filler, and electrically conductive filler.

3. The optoelectronic module of claim 1, wherein the at least one EMI attenuating component is injection molded.

4. The optoelectronic module of claim 1, wherein the at least one EMI attenuating component includes the PCB spacer and wherein the PCB spacer is configured to support the PCB and the second PCB inside of the housing.

5. A method comprising:
forcing a molten plastic material that includes nickel-coated carbon fiber or electrically conductive filler into a mold cavity of a mold;
solidifying the molten plastic material that includes the nickel-coated carbon fiber or electrically conductive filler into a shape that conforms to a contour of the mold to form a component of an optoelectronic module from the plastic material that includes the nickel-coated carbon fiber or electrically conductive filler, wherein the component comprises an electromagnetic interference ("EMI") attenuating component selected from a group consisting of:
a PCB spacer, wherein the PCB spacer is positioned between the PCB and a second PCB in a double-deck PCB arrangement;
a three-dimensional EMI absorber including a first portion defining a first plane extending transverse to the longitudinal axis of the housing and positioned between the PCB and one or both of a transmitter optical subassembly ("TOSA") and a receiver optical subassembly ("ROSA"), and a second portion defining a second plane extending transverse to the first plane and parallel to the longitudinal axis of the housing, wherein the second portion is positioned between the housing and the TOSA or the ROSA.

6. The method of claim 5, wherein the EMI attenuating component is injection molded.

7. The method of claim 5, wherein the EMI attenuating component includes the PCB spacer and wherein the PCB spacer is configured to support the PCB and the second PCB inside of the housing.

8. The method of claim 5, wherein the EMI attenuating component includes the fiber tray, the one or more internal optical cables is coupled to a transmitter optical subassembly ("TOSA") and a receiver optical subassembly ("ROSA"), and the fiber tray supports the TOSA and the ROSA.

9. The method of claim 5, wherein the EMI attenuating component includes the port retention bar that is disposed against the housing to retain the TOSA and the ROSA with respect to one another.

10. An optoelectronic module comprising:
a housing that extends along a longitudinal axis between a first end portion and a second end portion, the first end portion configured to interface with at least one fiber optic cable including one or more optical fibers;
a printed circuit board ("PCB") within the housing that includes an electrical connector at the second end portion of the housing;
at least one transmitter positioned inside of the housing, the transmitter electrically coupled to the PCB and optically coupled with at least one of the one or more optical fibers;
at least one receiver positioned inside of the housing, the receiver electrically coupled to the PCB and optically coupled with at least another one of the one or more optical fibers;
at least one electromagnetic interference ("EMI") attenuating component formed of a plastic material that is configured to attenuate EMI, wherein the at least one EMI attenuating component is configured to attenuate EMI generated by one or more other components of the optoelectronic module, the EMI attenuating comprising:
a fiber tray supporting one or more internal optical cables positioned inside of the housing.

* * * * *